United States Patent
Reznicek et al.

(10) Patent No.: US 11,101,290 B2
(45) Date of Patent: Aug. 24, 2021

(54) CROSS-POINT MULTILAYER STACKABLE FERROELECTRIC FIELD-EFFECT TRANSISTOR RANDOM ACCESS MEMORY

(71) Applicant: International Business Machines Corporation, Armonk, NY (US)

(72) Inventors: Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 16/397,524

(22) Filed: Apr. 29, 2019

(65) Prior Publication Data

US 2020/0343266 A1   Oct. 29, 2020

(51) Int. Cl.
*H01L 27/11597*   (2017.01)
*H01L 29/786*   (2006.01)
(Continued)

(52) U.S. Cl.
CPC .... *H01L 27/11597* (2013.01); *H01L 21/0214* (2013.01); *H01L 21/02181* (2013.01); *H01L 21/02675* (2013.01); *H01L 21/28158* (2013.01); *H01L 21/31122* (2013.01); *H01L 21/32136* (2013.01); *H01L 29/04* (2013.01); *H01L 29/40111* (2019.08); *H01L 29/4908* (2013.01); *H01L 29/516* (2013.01); *H01L 29/6684* (2013.01); *H01L 29/78391* (2014.09); *H01L 29/78642* (2013.01); *H01L 29/78672* (2013.01)

(58) Field of Classification Search
CPC ............. H01L 27/11597; H01L 29/516; H01L 29/6684; H01L 29/78391; H01L 27/11585–11597; H01L 29/78642; H01L 29/40111; H01L 21/02675; G11C 11/223
See application file for complete search history.

(56) References Cited

U.S. PATENT DOCUMENTS 5,767,543 A * 6/1998 Ooms ................. H01L 21/2855
257/315
9,818,848 B2   11/2017 Sun et al.
(Continued)

OTHER PUBLICATIONS

M. Jerry et al., "Ferroelectric FET Analog Synapse for Acceleration of Deep Neural Network Training," IEEE International Electron Devices Meeting (IEDM), Dec. 2-6, 2017, 4 pages.
(Continued)

*Primary Examiner* — Kevin Parendo
(74) *Attorney, Agent, or Firm* — Daniel Morris; Ryan, Mason & Lewis, LLP

(57) ABSTRACT

A method for manufacturing a semiconductor memory device includes forming a first polysilicon layer on a conductive layer, forming a second polysilicon layer stacked on the first polysilicon layer, and forming a third polysilicon layer stacked on the second polysilicon layer. In the method, a stacked structure of the first, second and third polysilicon layers is patterned into a plurality of stacked structures spaced apart from each other on the conductive layer. Ferroelectric dielectric layers are formed on respective second polysilicon layers of the plurality of stacked structures, and metal layers are formed on the ferroelectric dielectric layers.

20 Claims, 30 Drawing Sheets

(51) Int. Cl.

| | |
|---|---|
| *H01L 29/04* | (2006.01) |
| *H01L 29/51* | (2006.01) |
| *H01L 29/78* | (2006.01) |
| *H01L 29/66* | (2006.01) |
| *H01L 21/311* | (2006.01) |
| *H01L 21/3213* | (2006.01) |
| *H01L 29/49* | (2006.01) |
| *H01L 21/28* | (2006.01) |
| *H01L 21/02* | (2006.01) |

(56) References Cited

U.S. PATENT DOCUMENTS

| | | | |
|---|---|---|---|
| 9,875,784 B1* | 1/2018 | Li | G11C 11/2275 |
| 9,934,463 B2 | 4/2018 | Seo et al. | |
| 10,079,058 B1 | 9/2018 | Eleftheriou et al. | |
| 2002/0028541 A1* | 3/2002 | Lee | H01L 27/11556 |
| | | | 438/149 |
| 2008/0203443 A1* | 8/2008 | Wilson | H01L 27/11585 |
| | | | 257/260 |
| 2018/0012123 A1 | 1/2018 | Han et al. | |
| 2018/0165573 A1 | 6/2018 | Hsu et al. | |
| 2019/0074363 A1* | 3/2019 | Zhu | H01L 27/11521 |
| 2019/0237470 A1* | 8/2019 | Mine | H01L 27/11597 |

OTHER PUBLICATIONS

H. Mulaosmanovic et al., "Novel Ferroelectric FET Based Synapse for Neuromorphic Systems," Symposium on VLSI Technology Digest of Technical Papers, Jun. 5-8, 2017, 2 pages.

J. Müller et al., "Ferroelectric Hafnium Oxide: A CMOS-Compatible and Highly Scalable Approach to Future Ferroelectric Memories," IEEE International Electron Devices Meeting (IEDM), Dec. 9-11, 2013, 4 pages.

T. Gokmen et al., "Acceleration of Deep Neural Network Training with Resistive Cross-Point Devices: Design Considerations," Frontiers in Neuroscience, Jul. 21, 2016, Article 333, 13 pages, vol. 10.

* cited by examiner

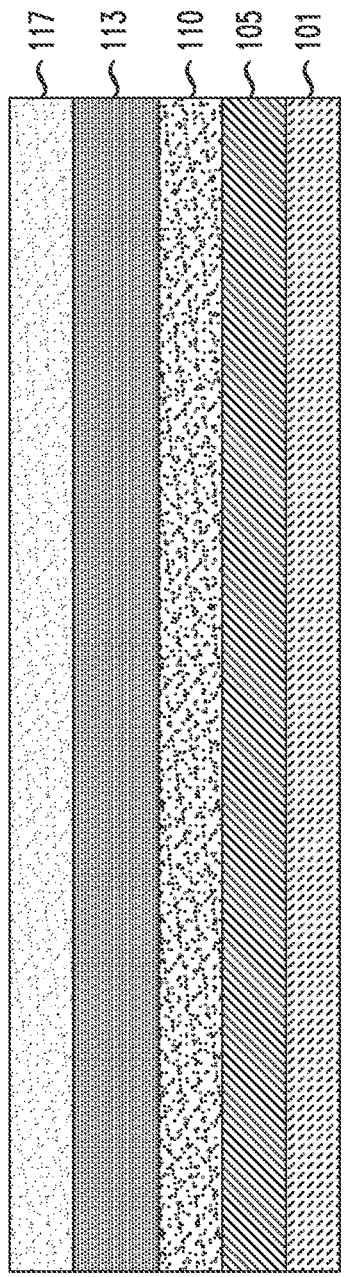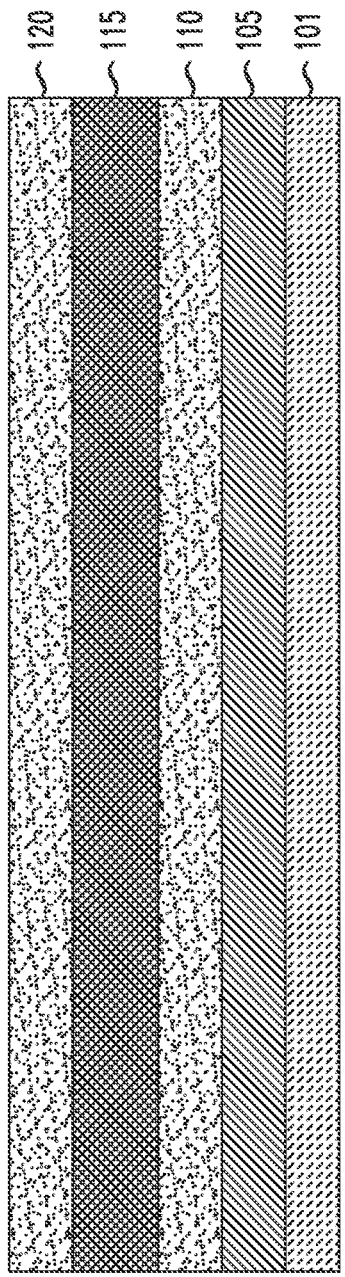

US 11,101,290 B2

CROSS-POINT MULTILAYER STACKABLE FERROELECTRIC FIELD-EFFECT TRANSISTOR RANDOM ACCESS MEMORY

BACKGROUND

Memory cells may include, for example, phase-change random-access memory (PCRAM), resistive random-access memory (RRAM or ReRAM), magnetic random-access memory (MRAM), and/or fuse/anti-fuse devices. RRAM devices have a three-layer structure of a top electrode, switching medium and bottom electrode.

Memory devices, such as, for example, RRAM devices, can be stacked in a three-dimensional (3D) configuration. Commercially available 3D memory devices include Crossbar™ ReRAM, from Crossbar, Inc. of Santa Clara, Calif., and 3D XPoint™, from Intel Corporation of Santa Clara, Calif. Storage in the 3D memory devices may be based on resistance changes in a stackable cross-gridded data access array.

Back-end-of-line (BEOL) requirements for selector devices to enable 3D stacking can include, for example, selector device fabrication temperatures below ~400° C. to prevent damage to BEOL metal lines, and after fabrication, selector devices being able to withstand temperatures of ~400° C., which may be the metallization temperature of upper layers.

There is interest in ferroelectric gate insulators, especially after recent findings about the feasibility of complementary metal-oxide semiconductor (CMOS) compatible ferroelectric materials and processes. Ferroelectricity in doped $HfO_2$ has been confirmed for several dopants (e.g., <10 mol % Yttrium (Y), Aluminum (Al), Gadolinium (Gd), Strontium (Sr), and Lanthanum (La)), and in thin films of $HfO_2$—$ZrO_2$ solid solutions (e.g. $HfZrO_4$).

Integration as planar transistors and fin field-effect transistor (FinFET) and lateral nanowire devices, and application as synaptic devices for neuromorphic computing have been demonstrated by various groups. However, the prior art demonstrations are not suitable for dense arrays, and also are not compatible with multilayer BEOL stacking, which is necessary for 3D memory structures.

SUMMARY

According to an exemplary embodiment of the present invention, a method for manufacturing a semiconductor memory device includes forming a first polysilicon layer on a conductive layer, forming a second polysilicon layer stacked on the first polysilicon layer, and forming a third polysilicon layer stacked on the second polysilicon layer. In the method, a stacked structure of the first, second and third polysilicon layers is patterned into a plurality of stacked structures spaced apart from each other on the conductive layer. Ferroelectric dielectric layers are formed on respective second polysilicon layers of the plurality of stacked structures, and metal layers are formed on the ferroelectric dielectric layers.

According to an exemplary embodiment of the present invention, a semiconductor device includes a plurality of select lines spaced apart from each other, and a plurality of stacked structures spaced apart from each other and formed on each select line of the plurality of select lines. Each of the plurality of stacked structures comprises a first polysilicon layer on a select line of the plurality of select lines, a second polysilicon layer on the first polysilicon layer, and a third polysilicon layer on the second polysilicon layer. The semiconductor device further includes a plurality of ferroelectric dielectric layers on respective second polysilicon layers of the plurality of stacked structures, and a plurality of metal layers on the plurality ferroelectric dielectric layers. A plurality of bitlines are spaced apart from each other and formed on the plurality of stacked structures.

According to an exemplary embodiment of the present invention, a method for manufacturing a semiconductor device includes forming a first polysilicon source/drain region on a conductive layer, forming a polysilicon channel region stacked on the first polysilicon source/drain region, and forming a second polysilicon source/drain region stacked on the polysilicon channel region. In the method, a stacked structure of the first and second polysilicon source/drain regions and the polysilicon channel region is patterned into a plurality of stacked structures spaced apart from each other on the conductive layer. Ferroelectric dielectric layers are formed on respective polysilicon channel regions of the plurality of stacked structures, and metal layers are formed on the ferroelectric dielectric layers. The method further includes forming a plurality of bitlines on the second polysilicon source/drain regions of the plurality of stacked structures.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 4 is schematic cross-sectional view illustrating manufacturing of a memory device and showing formation of layers of moderately and highly doped silicon, according to an embodiment of the invention.

FIG. 5 is schematic cross-sectional view illustrating manufacturing of a memory device and showing transformation of the layers of moderately and highly doped Si to polysilicon, according to an embodiment of the invention.

DETAILED DESCRIPTION

Figure 1:
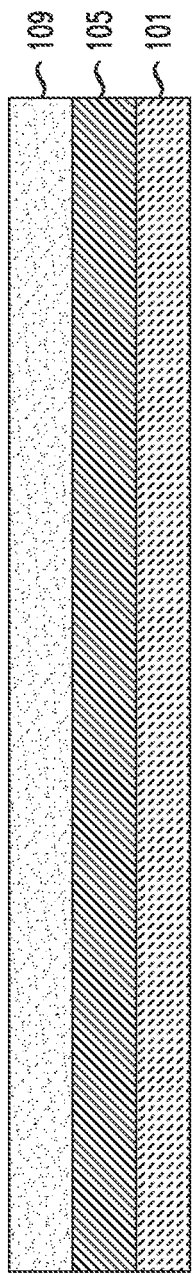
FIG. 1 is a schematic cross-sectional view illustrating manufacturing of a memory device and showing a select line and a highly doped amorphous silicon (a-Si) layer formed on a dielectric layer, according to an embodiment of the invention.

Exemplary embodiments of the invention will now be discussed in further detail with regard to semiconductor devices and methods of manufacturing same and, in particular, to forming BEOL compatible memory devices with ferroelectric gate (e.g., wordline) insulators in a 3D stacked structure.

It is to be understood that the various layers and/or regions shown in the accompanying drawings are not drawn to scale, and that one or more layers and/or regions of a type commonly used in, for example, random-access memory (RAM), phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, RAM, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to RAM, PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use RAM, PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Memory devices, (e.g., RAM, RRAM devices) according to one or more embodiments, are stacked in a three-dimensional (3D) cross-point configuration. As used herein, a "cross-point" structure includes a configuration of memory cells at the intersection of wordlines and bitlines. In the structure, each of the memory cells can be addressed individually, so that data can be written and read in small sizes. As used herein, a "3D cross-point" structure includes two or more stacked layers of cross-point/crossbar memory structures. Storage in RRAM devices is based on resistance changes in a stackable cross-gridded data access array.

One or more embodiments relate to methods and structures to form BEOL compatible semiconductor devices. In accordance with one or more embodiments, vertical dense integration and multilayer BEOL-compatible stacking is enabled to form 3D cross-point structures. The 3D multilayer stacking is enabled by appropriate use of laser crystallization (e.g., excimer laser annealing) to convert low-temperature deposited semiconductor materials (e.g., less than ~400° C.) into high-quality poly-crystalline materials without damaging the underlying metallization lines.

In addition, in accordance with one or more embodiments, a cross-point multilayer BEOL stackable FET RAM is formed for neuromorphic computing and hardware acceleration of deep neural networks. Ferroelectricity of a dielectric material provides a memory function for each memory cell, wherein the ferroelectric dielectric material is programmed to have a memory function, which will change the conductance of a channel of a transistor depending on the ferroelectric polarization of the gate dielectric material.

In accordance with one or more embodiments, memory elements comprising gate-controlled three terminal (3T) transistor structure are used to form dense cross-point memory structures. The cross-point memory structures can be stacked to form 3D cross-point memory structures.

FIG. 1 is a schematic cross-sectional view illustrating manufacturing of a memory device and showing a select line 105 and a highly doped amorphous silicon (a-Si) layer 109 formed on a dielectric layer 101, according to an embodiment of the invention.

The material of the dielectric layer 101 can include, but is not necessarily limited to, a low-K dielectric material, such as, for example, silicon oxide, silicon nitride, silicon oxynitride, boron nitride, and/or silicon boron nitride. The dielectric layer 101 is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), and/or sputtering, which may be followed by a planarization process, such as, chemical mechanical polishing (CMP), to remove excess portions of the layer 101 after deposition.

Figure 8:
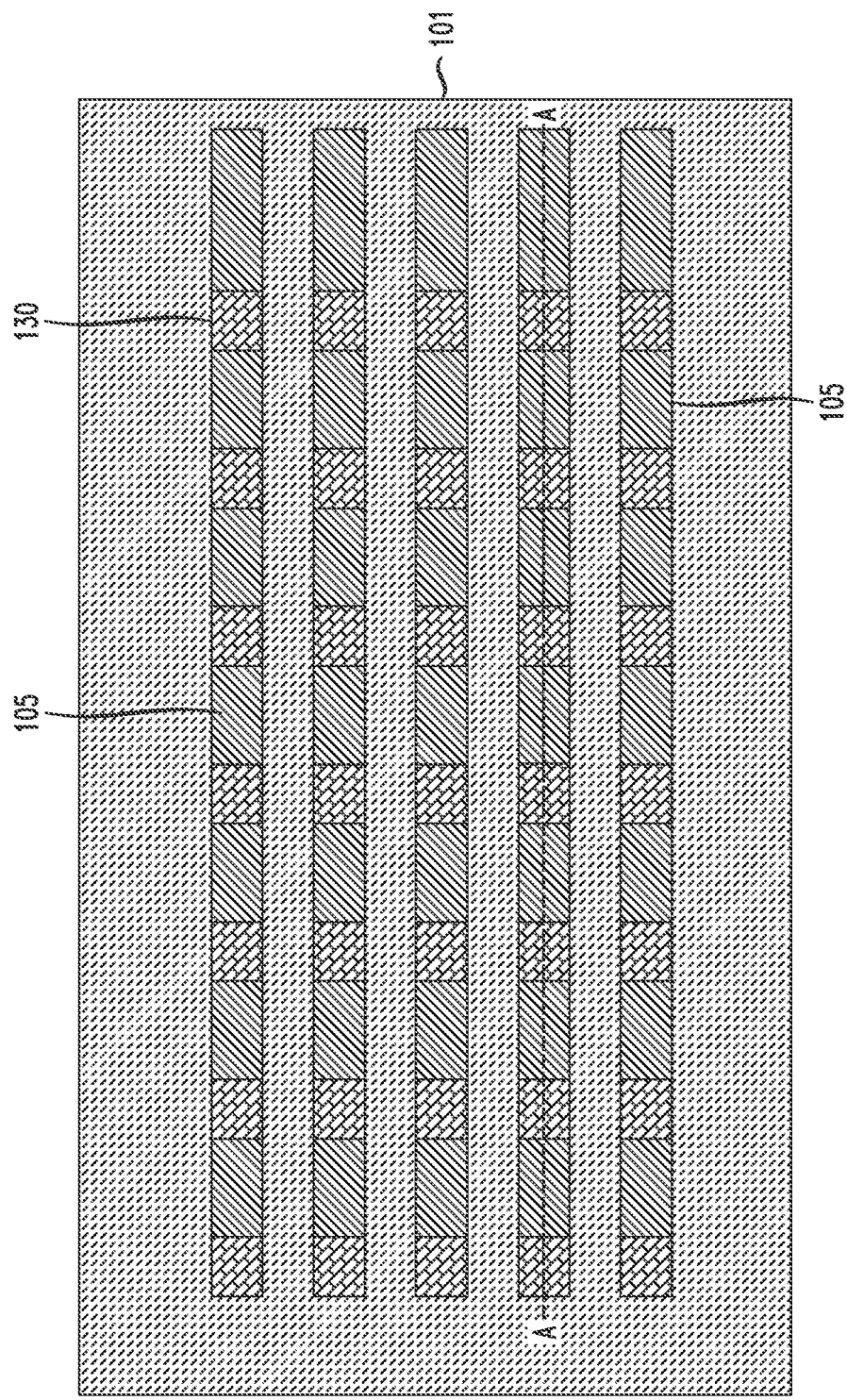
FIG. 8 is a schematic top view illustrating manufacturing of a memory device and showing patterning of the stacked hardmask and polysilicon layers into pillars on the select lines, according to an embodiment of the invention.

The material of the select line 105 can include an electrically conductive material, such as, but not necessarily limited to, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The select line 105 can be deposited using, for example, CVD, PECVD, RFCVD, PVD, ALD, MLD, MBD, PLD, LSMCD, and/or sputtering, followed by planarization by, for example, CMP. The select line 105 can be patterned to form a plurality of select lines spaced apart from each other, using, for example, photolithography and reactive ion etching (ME) which may optionally include a dielectric hardmask such as oxide or nitride. In accordance with one or more embodiments, a plurality of select lines 105 are formed to be spaced apart from each other on a dielectric layer 101 (e.g., an inter-layer dielectric (ILD) layer). The top view in FIG. 8 illustrates a plurality of select lines 105 spaced apart from each other on the dielectric layer 101. Alternatively, as described further in connection with FIG. 8, the select line 105 is not patterned, thus forming a common select electrode for all cells.

A highly doped a-Si layer 109 is formed on each of the select lines 105. In accordance with an embodiment of the present invention, the a-Si layer 109 is n$^+$ doped, and is doped with, for example, arsenic (As) or phosphorus (P) at a total concentration in the general range of $10^{20}/cm^3$-$10^{21}/cm^3$. As explained herein below, a stacked n$^+$-p-n$^+$ structure is formed. Alternatively, a p$^+$-n-p$^+$ structure is formed, where the a-Si layer 109 is p$^+$ doped, and is doped with, for example, boron (B) at a total (i.e. active and/or inactive) concentration in the general range of $10^{20}/cm^3$-$10^{21}/cm^3$. A stacked p$^+$-i-p$^+$ structure, a stacked n$^+$ i-n$^+$ structure, a stacked p$^+$-p$^-$-p$^+$ structure, or a stacked n$^+$-n$^-$-n$^+$ structure, may also be formed in some embodiments. It will be appreciated that stacked structures such as, for example, p$^+$-i-n$^+$, p$^+$-n-n$^+$, p$^+$-p-n$^+$, n$^+$-n-p$^+$ or n$^+$-p-p$^+$, which result in tunneling field-effect transistors may also be used in some embodiments.

A thickness (e.g., height with respect to the underlying layer) of the highly doped a-Si layer 109 can be approximately 5 nm-25 nm, but thinner or thicker layers may be used as well. The a-Si layer can be deposited using, for example CVD, PECVD, RFCVD, hot-wire CVD (HWCVD), PVD, ALD, MLD, MBD, PLD, LSMCD, and/or sputtering. The percentage of the active doping concentration in a-Si may be, for example, in the range of 1-10%. The a-Si layer may be doped in-situ during deposition (e.g. with dopant gases introduced in the gas mixture in CVD-based techniques, or using a doped solid target in PVD-based techniques) or introduced after deposition, e.g. using ion-implantation. The a-Si films may contain elements such as, e.g. hydrogen (H), helium (He), argon (Ar), nitrogen (N), germanium (Ge) and carbon (C) which may be incorporated into the film, e.g. from precursor gases and/or carrier gases during growth.

Figure 2:
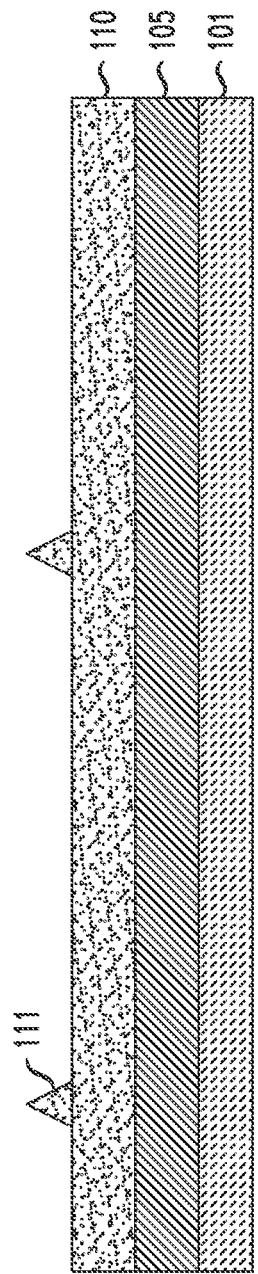
FIG. 2 is a schematic cross-sectional view illustrating manufacturing of a memory device and showing transformation of the highly doped a-Si to polysilicon, according to an embodiment of the invention.

FIG. 2 is a schematic cross-sectional view illustrating manufacturing of a memory device and showing transformation of the highly doped a-Si to polysilicon, according to an embodiment of the invention. Referring to FIG. 2, the a-Si layer 109 is crystallized into a polysilicon layer 110 using, for example, laser crystallization, such as ELA, which can be performed at a temperature of less than ~400° C. Laser pulses with short durations generate local heat which may be efficiently dissipated, allowing for maintaining the substrate at temperatures as low as room temperature (or lower than room temperature if substrate cooling is used). The polysilicon layer 110 has the same doping type and about the same doping concentration as the a-Si layer 109.

A small portion of dopant species may escape from the surface in gaseous form during crystallization; however, the percentage of active doping may substantially improve after crystallization, e.g., from 1-10% to over 95%. Once patterned, the respective patterned portions of the polysilicon layer 110 function as lower source/drain regions of respective transistor stacks of each memory cell.

During the laser annealing process, surface protrusions 111 (also referred to as surface spikes) may be formed on the surface of the resulting polysilicon layer 110. Some preparation methods and/or conditions (e.g., one-shot ELA), may result in surface protrusions at grain-boundary locations.

In one example, the excimer laser energy density (fluence) is in the range of 350 mJ/cm$^2$-450 mJ/cm$^2$, the laser pulse width is in the range of 10 ns-50 ns and the repetition rate is in the range of 100 Hz-1 KHz. The number of laser pulses (shots) may be in range of 1-100, but a larger number of pulses may also be used. Other laser crystallization techniques known in the art, such as sequential lateral solidification (SLC) may also be used. In embodiments where a-Si contains volatile elements, such as H, Ar and He, a low-temperature thermal treatment (e.g. furnace anneal at 400° C.) or low-energy laser treatment (e.g. with fluence below 300 mJ/cm$^2$) may be performed before laser crystallization to substantially reduce the concentration of the volatile elements (e.g., to lower than 1%) in order to avoid explosive release of these elements (and therefore formation of voids) during laser crystallization.

Figure 3:
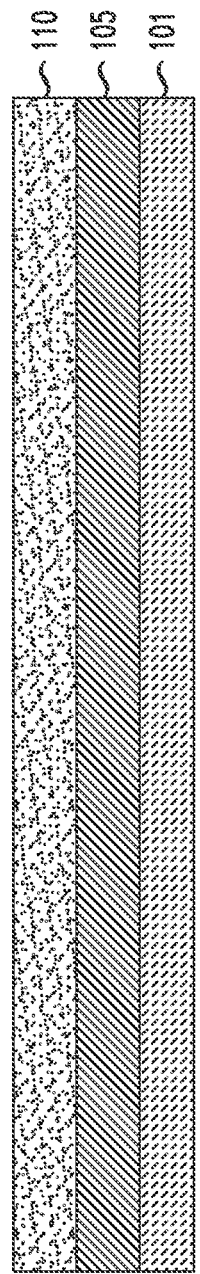
FIG. 3 is a schematic cross-sectional view illustrating manufacturing of a memory device and showing removal of surface spikes formed as a result of the transformation of the highly doped a-Si to polysilicon, according to an embodiment of the invention.

FIG. 3 is a schematic cross-sectional view illustrating manufacturing of a memory device and showing removal of surface spikes formed as a result of the transformation of the highly doped a-Si to polysilicon, according to an embodiment of the invention. Referring to FIG. 3, the surface protrusions 111 may be removed, using chemical and/or mechanical methods, such as, for example, CMP.

FIG. 4 is schematic cross-sectional view illustrating manufacturing of a memory device and showing formation of layers of moderately and highly doped silicon, according to an embodiment of the invention. Referring to FIG. 4, moderately and highly doped silicon layers 113 and 117 are formed on the highly doped polysilicon layer 110. In accordance with an embodiment of the present invention, p-doped and n+ doped polycrystalline Si layers 113 and 117 are grown epitaxially (i.e. following the crystalline structure of the polysilicon layer 110) using low-temperature techniques such as PECVD and HWCVD; or a-Si, nano-crystalline silicon (nc-Si), or micro-crystalline silicon (μc-Si) layers 113, 117 are deposited non-epitaxially using techniques, such as, for example, CVD, PECVD, HWCVD, RFCVD, PVD, ALD, MLD, MBD, PLD, LSMCD, and/or sputtering; and converted into polysilicon after deposition, e.g. by laser crystallization (see, e.g., FIG. 5). The conversion into polysilicon may be epitaxial (i.e., layers 113 and 117 follow the crystalline structure of the polysilicon layer 110 during crystallization) or may be non-epitaxial (i.e., layers 113 and 117 do not follow the crystalline structure of the polysilicon layer 110 during crystallization). In other embodiments, layer 113 may be lightly-doped (e.g. p$^-$ or n$^-$), or substantially undoped (also referred to as intrinsic or i). The growth and crystallization of a lightly-doped or an undoped layer is performed using the same techniques described with respect to a moderately doped layer 113.

Low-temperature epitaxial growth of the highly doped and moderately doped layers 117, 113 may be performed using plasma-enhanced chemical vapor deposition (PECVD) at temperatures below ~400° C., such as, 150° C.-350° C., in some embodiments. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In a low-temperature epitaxial deposition process, the system parameters are set such that the carrier (e.g. hydrogen) radicals present in the gas mixture selectively remove the weak atomic bonds formed on the growth surface (which would otherwise result in non-crystalline growth) thus resulting in a semiconductor material that has substantially the same crystalline characteristics as the deposition surface on which the epitaxially grown material is formed. In one example, a mixture of $SiH_4$ (silane) and $H_2$ (hydrogen) gases with a gas flow ratio of $[H_2]/[SiH_4]>5$ is used for PECVD epitaxy and the resulting epitaxial polysilicon layer contains between 5-40% hydrogen. The system parameters may be set (e.g. $[H_2]/[SiH_4]<5$) such that the growth is non-epitaxial, i.e., resulting in hydrogenated a-Si, nc-Si or µc-Si.

The epitaxial deposition process may employ the deposition chamber of a plasma-enhanced chemical vapor deposition (PECVD) apparatus where plasma may be generated from a DC source, an RF source or very-high-frequency (VHF) source; or a hot-wire chemical vapor deposition (HWCVD) apparatus. A number of different sources may be used for the epitaxial deposition of an in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. By "in-situ", it is meant that the dopant that dictates the conductivity type of the doped layer is introduced during the process step, e.g., epitaxial deposition, that forms the doped layer. Dopant gases used for n-type doping may include, e.g., phosphine ($PH_3$) and arsine ($AsH_3$), and the dopant gases used for p-type doping may include, e.g., diborane ($B_2H_6$) or Trimethylborane ($B(CH_3)_3$, also known as TMB).

In accordance with an embodiment of the present invention, the layer 113 is p-doped, and is doped with, for example, boron (B) at a concentration in the general range of $5\times10^{18}/cm^3$-$5\times10^{19}/cm^3$, and the layer 117 is n+ doped, and is doped with, for example, arsenic (As) or phosphorous (P) at a concentration in the general range of $10^{20}/cm^3$-$10^{21}/cm^3$. As explained herein, a stacked $n^+$-p-$n^+$ structure is formed. Alternatively, a $p^+$-n-$p^+$ structure is formed, where the layer 113 is n-doped, and the layer 117 is $p^+$ doped. A stacked $p^+$-i-$p^+$ structure, a stacked $n^+$-i-$n^+$ structure, a stacked $p^+$-$p^-$-$p^+$ structure, or a stacked $n^+$-$n^-$-$n^+$ structure, may also be formed. A thickness (e.g., height with respect to the underlying layer) of the layers 113 and 117 can be approximately 3 nm-approximately 15 nm, but thicker or thinner layers may be used as well.

FIG. 5 is schematic cross-sectional view illustrating manufacturing of a memory device and showing transformation of the layers of moderately and highly doped Si to polysilicon, according to an embodiment of the invention. Referring to FIG. 5, a-Si, nano-crystalline silicon (nc-Si), or micro-crystalline silicon (µc-Si) layers 113, 117 are crystallized to result in moderately and highly doped polysilicon layers 115 and 120. Similar to what is described in connection with FIG. 2, laser crystallization, such as ELA, can be performed at a temperature of less than ~400° C. to transform the layers 113, 117 into polysilicon layers 115, 120. The polysilicon layers 115, 120 have the same doping as the layers 113, 117, but the doping activation may improve during crystallization. Although not shown, like the surface protrusions 111 discussed in connection with FIG. 2, surface protrusions may be formed on the surface of the resulting polysilicon layer 120 as a result of a laser annealing process, which can be removed using chemical and/or mechanical methods, such as, for example, CMP.

In embodiments where layers 113 and 117 are grown epitaxially and therefore are polycrystalline after growth, a laser treatment step may be optionally performed to improve the crystallinity (e.g. reduce the crystal defects) and/or increase doping activation in layers 113 and 117. Other treatments generally known to improve crystallinity, increase doping activation and/or passivate dangling bonds, such as, e.g., rapid thermal annealing (RTA), forming gas anneal (FGA) and flash lamp anneal, may also be optionally used in conjunction with laser crystallization or laser treatment, as long as the treatment temperature is maintained below ~400° C.

Figure 6:
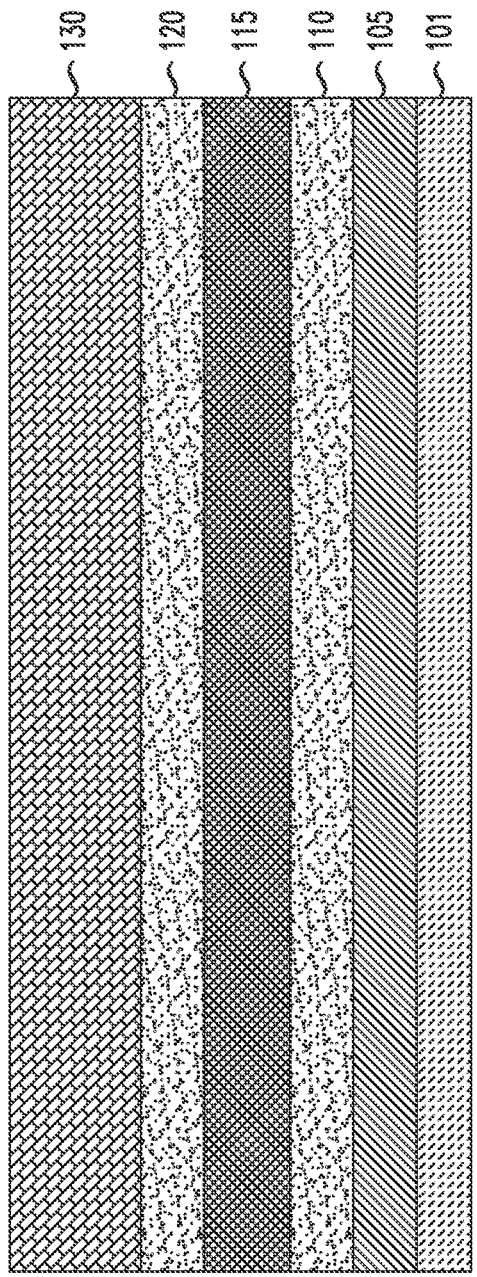
FIG. 6 is a schematic cross-sectional view illustrating manufacturing of a memory device and showing formation of a hardmask on the upper polysilicon layer from FIG. 5, according to an embodiment of the invention.

FIG. 6 is a schematic cross-sectional view illustrating manufacturing of a memory device and showing formation of a hardmask on the upper polysilicon layer from FIG. 5, according to an embodiment of the invention. Referring to FIG. 6, a hardmask layer 130 is formed on the upper polysilicon layer 120 of the stack including the polysilicon layers 110, 115 and 120. In accordance with an embodiment of the present invention, a thickness (e.g., height with respect to the underlying layer) of the hardmask layer 130 can be approximately 3 nm-approximately 25 nm, but thicker or thinner layers may be used as well. The hardmask layer 130 can be deposited using, for example CVD, PECVD, RFCVD, HWCVD, PVD, ALD, MLD, MBD, PLD, LSMCD, and/or sputtering. According to one or more embodiments, the hardmask 130 comprises a dielectric material, such as, but not necessarily limited to, silicon nitride (SiN).

Figure 7:
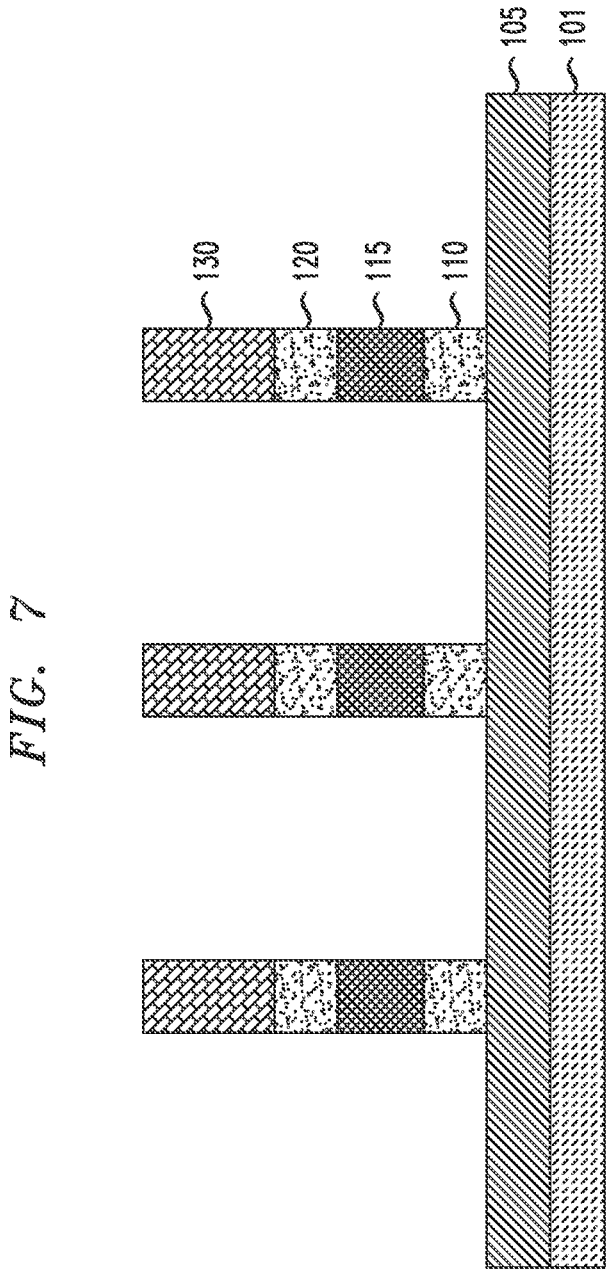
FIG. 7 is a schematic cross-sectional view taken along the line A-A in FIG. 8 illustrating manufacturing of a memory device and showing patterning of the stacked hardmask and polysilicon layers into pillars on the select lines, according to an embodiment of the invention.

FIG. 7 is a schematic cross-sectional view taken along the line A-A in FIG. 8, and FIG. 8 is a schematic top view illustrating manufacturing of a memory device and showing patterning of the stacked hardmask and polysilicon layers into pillars on the select lines, according to an embodiment of the invention. Referring to FIGS. 7 and 8, the stacks including the hardmask layer 130 on the stacked polysilicon layers 110, 115 and 120 are patterned using an etching process, such as, for example, reactive ion etching (RIE) to result in pillar/columnar structures spaced apart from each other on the select lines 105, each columnar structure including layers 130, 120, 115 and 110 in descending order. As can be understood, the according to an embodiment, the polysilicon layers 110, 115 and 120 are n+, p and n+ doped, respectively. Alternatively, the polysilicon layers 110, 115 and 120 are $p^+$, n and $p^+$ doped, respectively. The etch can be performed using, such as, e.g., an $SF_6/O_2$ plasma, $SF_6/CHF_3$ plasma or $CF_4$ plasma, The hardmask 130 masks portions of the stacked structures including layers 120, 115 and 110 not being etched, and exposes remaining portions of the stacked structures that are to be etched.

In a non-limiting process example, the SiN hardmask 130 and $n^+$-p-$n^+$ polysilicon stack (120-115-110), and the select lines 105 are patterned stopping on the ILD layer 101 using a first mask to form lines. Then, the SiN hardmask 130 and $n^+$-p-$n^+$ polysilicon stack (120-115-110) are patterned stopping on the select lines 105 using a second mask to form pillars on the select lines 105. In some embodiments, the select line 105 is not patterned, thus forming a common select electrode for all cells. In these embodiments, the pillars can be formed using a single mask.

Figure 9:
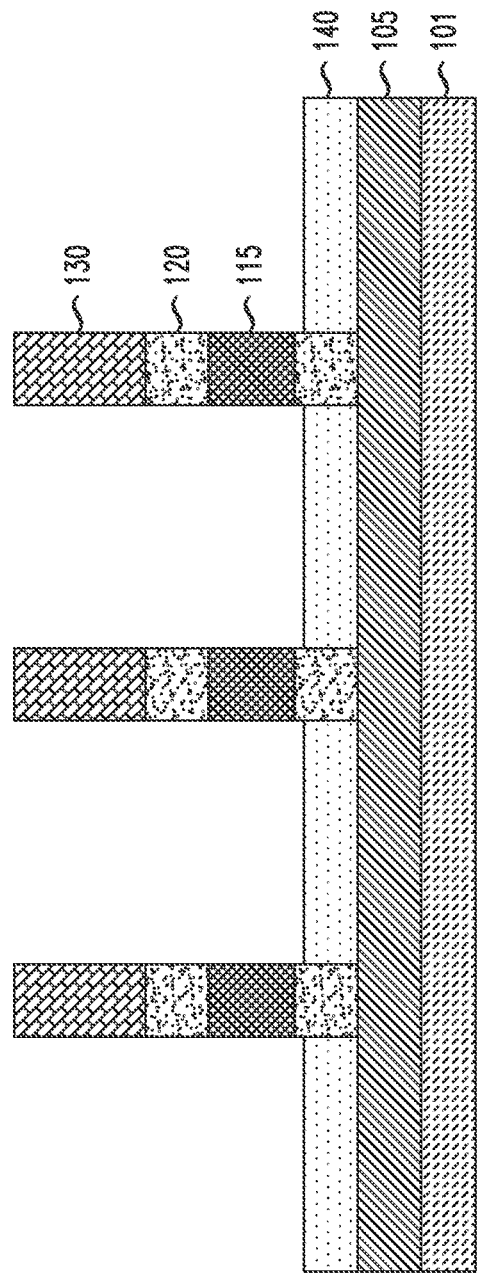
FIG. 9 is a schematic cross-sectional view taken along the line A-A in FIG. 10 illustrating manufacturing of a memory device and showing formation of a dielectric layer on the structure of FIGS. 7 and 8, according to an embodiment of the invention.
Figure 10:
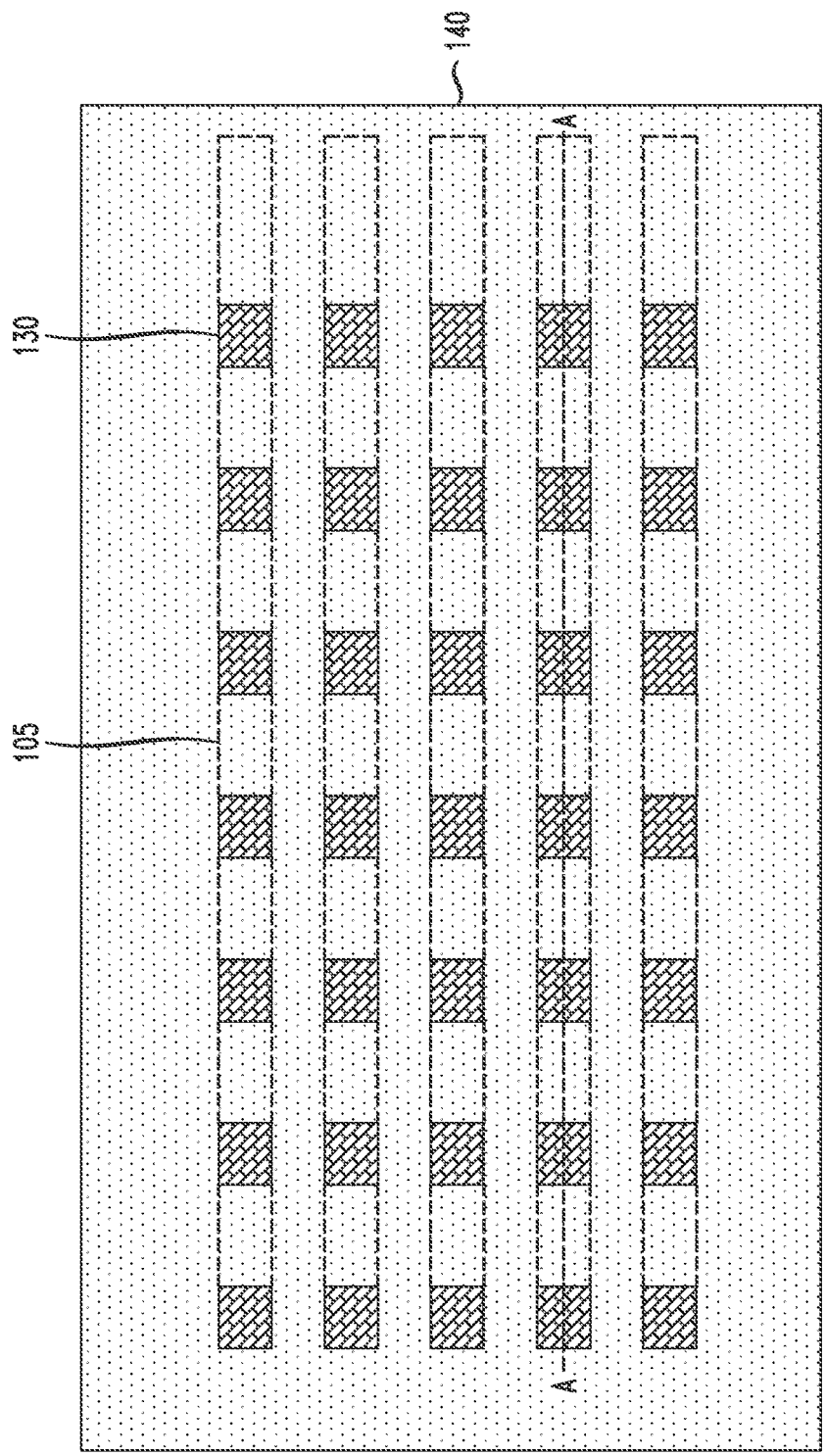
FIG. 10 is a schematic top view illustrating manufacturing of a memory device and showing formation of a dielectric layer on the structure of FIGS. 7 and 8, according to an embodiment of the invention.

FIG. 9 is a schematic cross-sectional view taken along the line A-A in FIG. 10, and FIG. 10 is a schematic top view illustrating manufacturing of a memory device and showing formation of a dielectric layer on the structure of FIGS. 7 and 8, according to an embodiment of the invention. Referring to FIGS. 9 and 10, a dielectric layer 140, such as, for example, an oxide, is formed on the select lines 105 in the spaces between the patterned stacked structures including the layers 110, 115, 120 and 130, and on the ILD layer 101 in the spaces between the select lines 105. The material of the dielectric layer 140 can include, but is not necessarily limited to, a low-K dielectric material, such as, for example, silicon oxide. The dielectric layer 140 can be deposited using deposition techniques such as, for example, CVD, PECVD, RFCVD, PVD, ALD, MBD, PLD, and/or LSMCD, and/or sputtering, followed by etching, such as RIE, to recess the deposited dielectric layer 140 to a desired height. Alternatively, a flowable oxide can be deposited to the desired height of the dielectric layer 140 using, for example, CVD. A thickness (e.g., height with respect to the underlying layer) of the layer 140 can be approximately 5 nm-approximately 20 nm, but thicker or thinner layers may be used as well.

Figure 11:
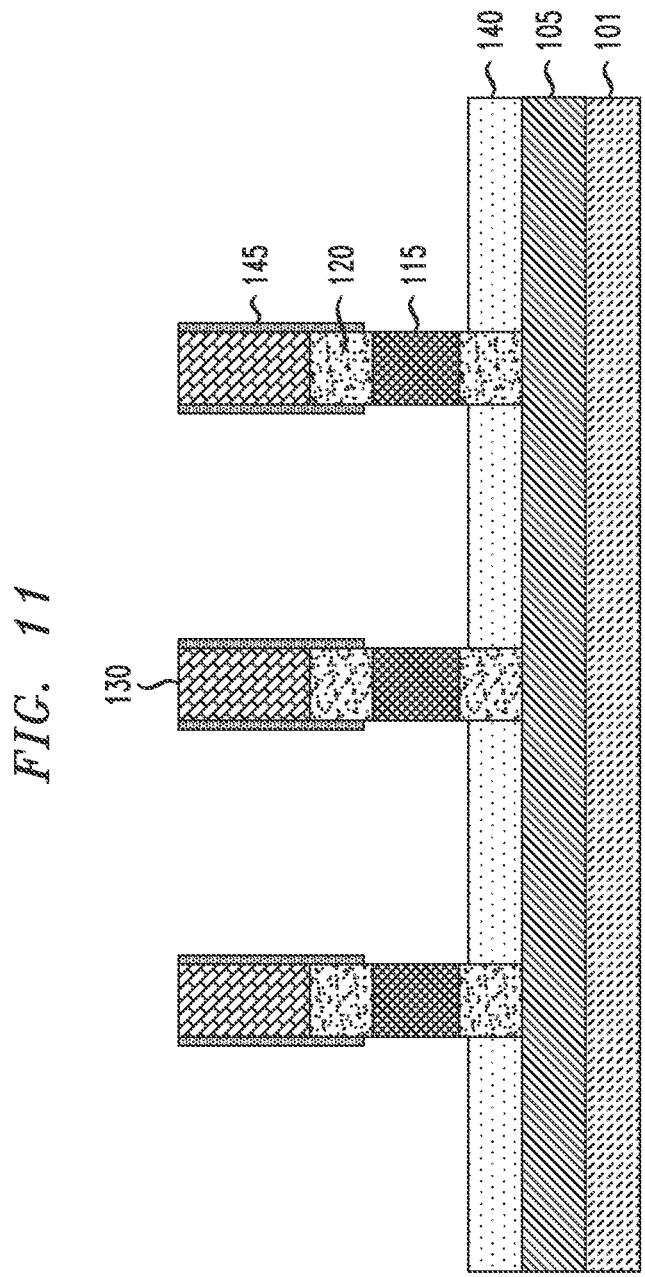
FIG. 11 is a schematic cross-sectional view taken along the line A-A in FIG. 12 illustrating manufacturing of a memory device and showing formation of hanging spacers, according to an embodiment of the invention.
Figure 12:
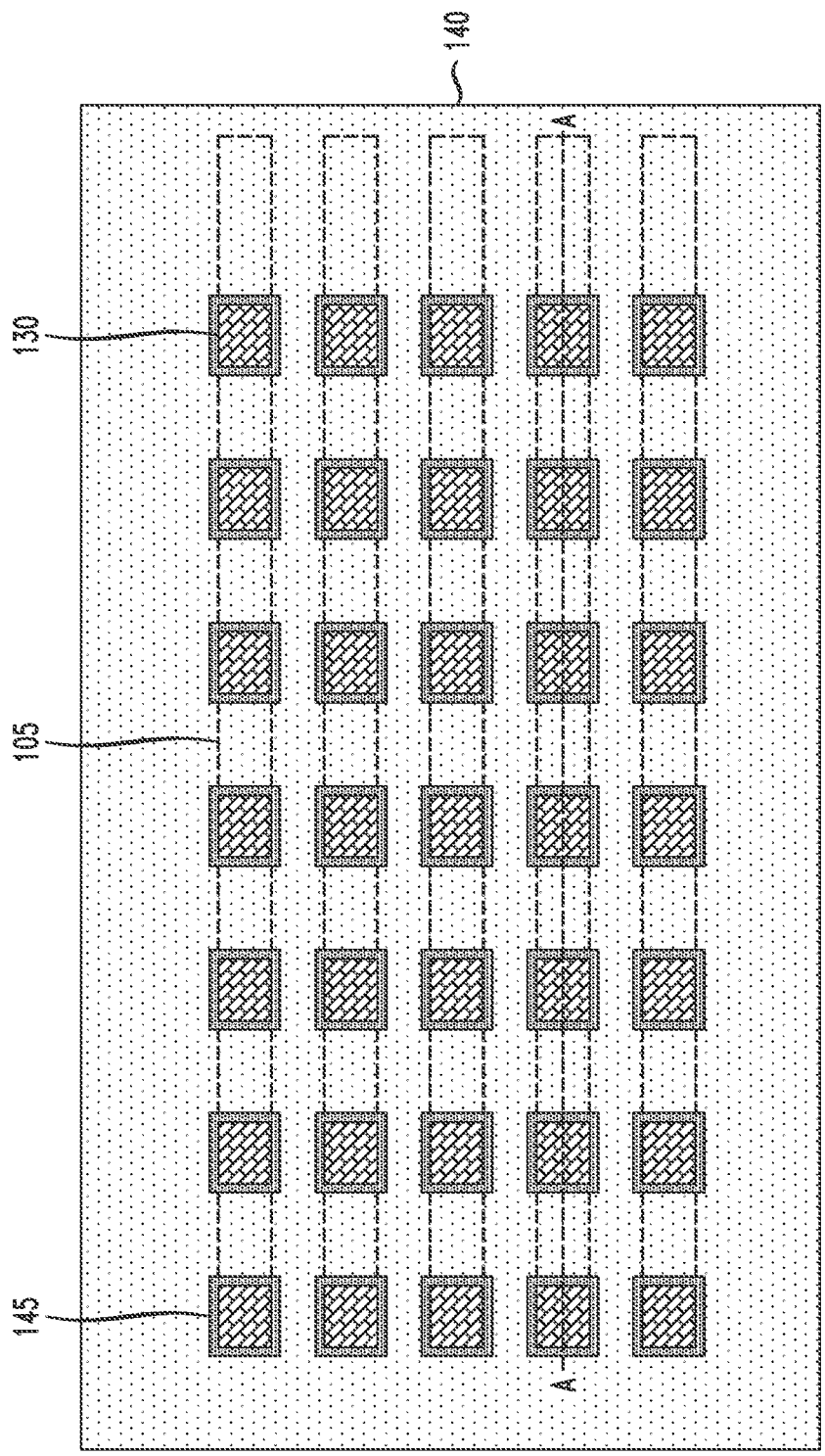
FIG. 12 is a schematic top view illustrating manufacturing of a memory device and showing formation of hanging spacers, according to an embodiment of the invention.

FIG. 11 is a schematic cross-sectional view taken along the line A-A in FIG. 12, and FIG. 12 is a schematic top view illustrating manufacturing of a memory device and showing formation of hanging spacers, according to an embodiment of the invention. Referring to FIGS. 11 and 12, hanging spacers 145 are formed on sides of the patterned stacked structures. The spacers 145 are referred to herein as "hanging" because they do not extend all the way down to the dielectric layer 140, and appear to be suspended from top surfaces of the hardmasks 130. The hanging spacers 145 are formed on and cover the sides of the hardmask layers 130. The hanging spacers 145 also extend down to and are formed on part of the sides of the upper polysilicon layer 120. The hanging spacers 145 can be formed using a variety of techniques. According to an embodiment, the hanging spacers 145 are formed by depositing a sacrificial insulating layer (not shown) on the dielectric layer 140, recessing the sacrificial insulating layer to a height where the hanging spacers are to end (e.g., even with a lower portion of the upper polysilicon layer 120 as in FIG. 11), depositing the material of the hanging spacers 145 by conformal deposition (e.g., ALD or CVD), performing an isotropic etch to remove horizontal portions of the deposited spacer material to form the hanging spacers 145, and selectively removing (e.g., etching or stripping) the sacrificial insulating layer. The material of the hanging spacers 145 includes, but is not necessarily limited to, silicon oxide, silicon nitride, silicon oxynitride, boron nitride, and/or silicon boron nitride. As can be seen in FIG. 12, the hanging spacers 145 surround the hardmask layers 130 and the portions of the upper polysilicon layers 120 on all lateral sides. A thickness of the hanging spacers 145 with respect to the layers 130 and 120 on which they are formed is about 5 nm-about 10 nm.

Figure 13:
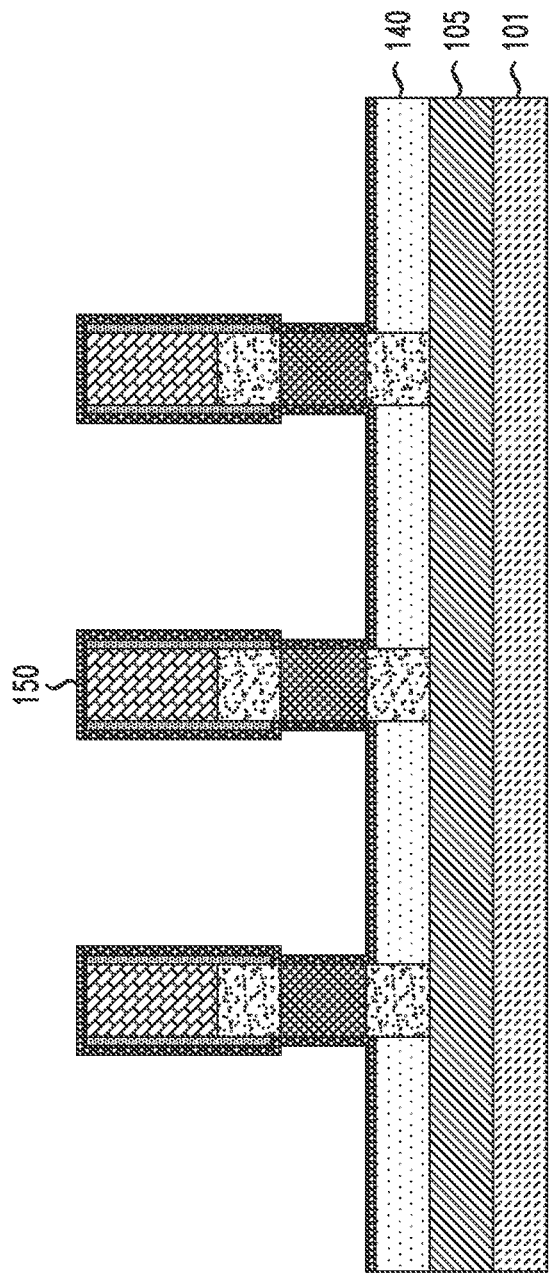
FIG. 13 is a schematic cross-sectional view taken along the line A-A in FIG. 14 illustrating manufacturing of a memory device and showing formation of a ferroelectric high-k dielectric layer on the structure of FIGS. 11 and 12, according to an embodiment of the invention.
Figure 14:
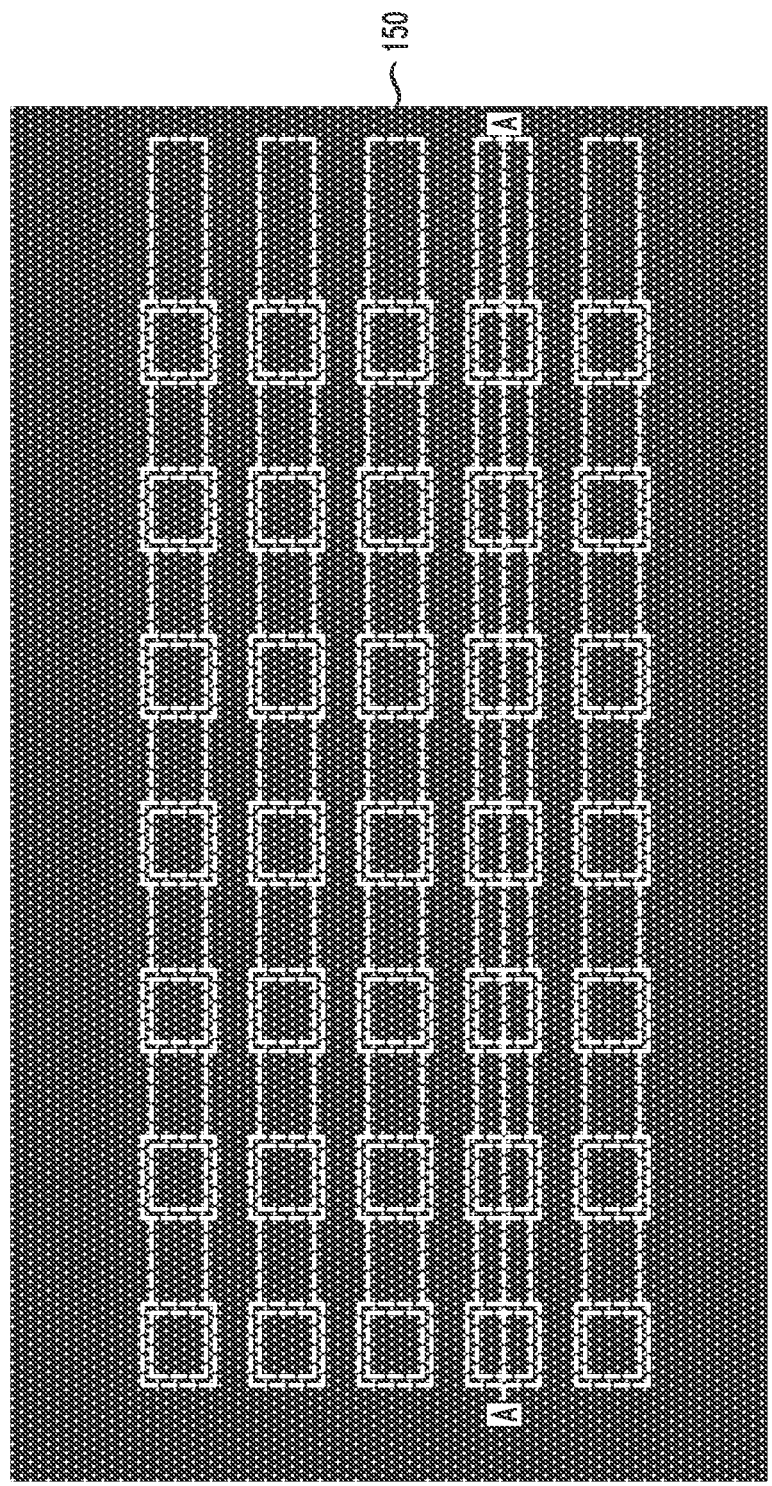
FIG. 14 is a schematic top view illustrating manufacturing of a memory device and showing formation of a ferroelectric high-k dielectric layer on the structure of FIGS. 11 and 12, according to an embodiment of the invention.

FIG. 13 is a schematic cross-sectional view taken along the line A-A in FIG. 14, and FIG. 14 is a schematic top view illustrating manufacturing of a memory device. Referring to FIGS. 13 and 14, a ferroelectric high-k dielectric layer 150 is formed on the structure of FIGS. 11 and 12. The ferroelectric high-k dielectric layer 150 is conformally deposited using a conformal deposition technique such as, for example, ALD or CVD. The ferroelectric high-k dielectric layer 150 comprises, for example, $HfO_2$ doped with dopant elements such as, for example, lower than 10 mol % Y, Al, Gd, Sr, or La; or thin films of $HfO_2$—$ZrO_2$ solid solutions (e.g. $HfZrO_4$). A thickness of the ferroelectric high-k dielectric layer 150 with respect to the layers on which they are formed is about 5 nm-about 10 nm. As can be seen in FIGS. 13 and 14, the ferroelectric high-k dielectric layer 150 is formed on all exposed surfaces including the exposed top surfaces of the hardmasks 130, the exposed top, side and bottom surfaces of the hanging spacers 145, the exposed side surfaces of the polysilicon layers 120, 115 and 110, and the exposed top surfaces of the dielectric layer 140.

Figure 15:
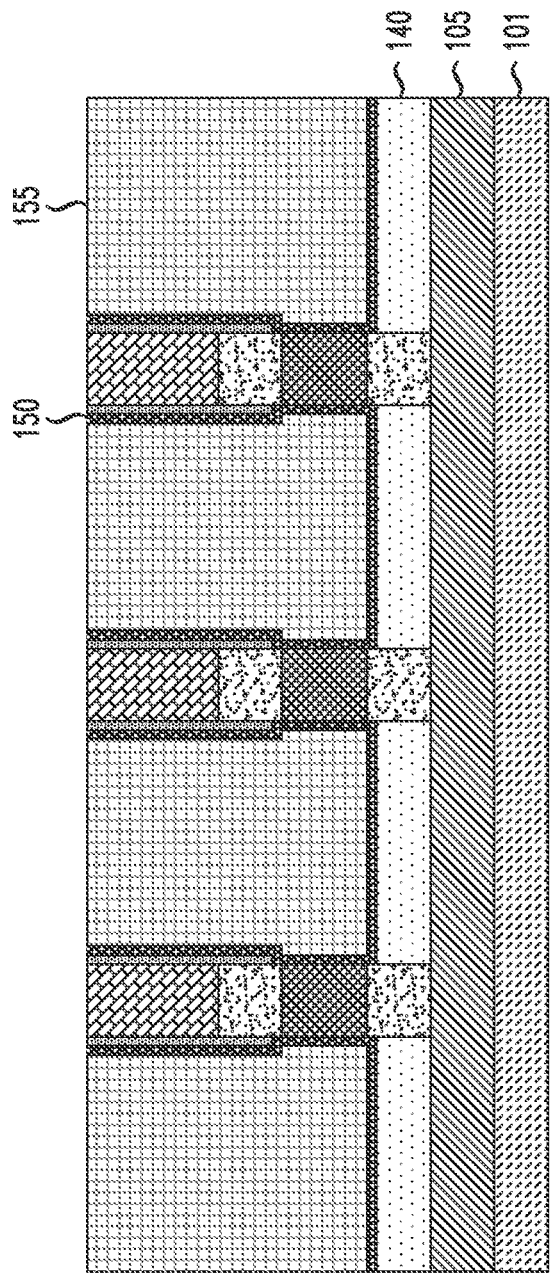
FIG. 15 is a schematic cross-sectional view taken along the line A-A in FIG. 16 illustrating manufacturing of a memory device and showing metal deposition on the structure of FIGS. 13 and 14, according to an embodiment of the invention.
Figure 16:
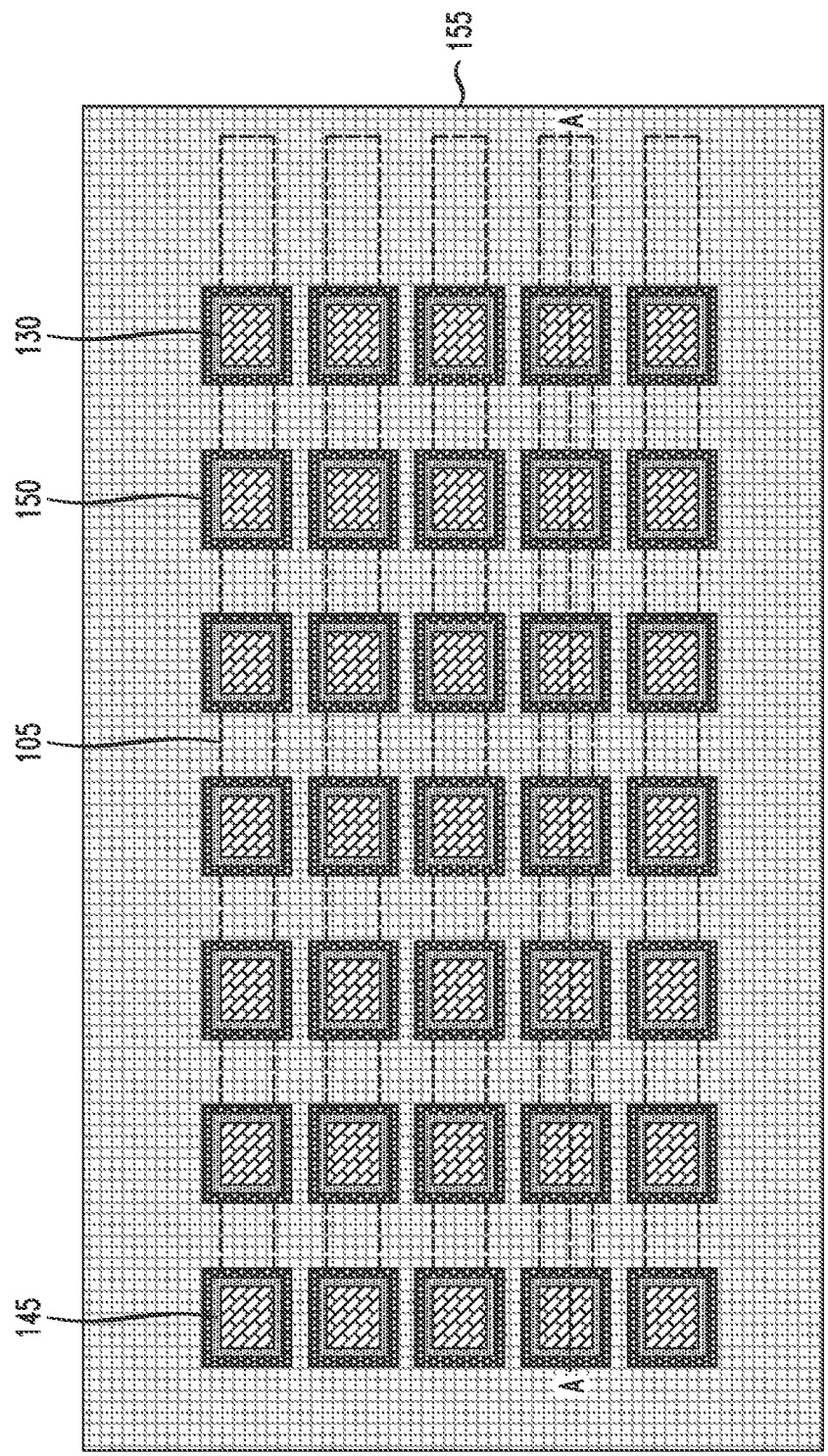
FIG. 16 is a schematic top view illustrating manufacturing of a memory device and showing metal deposition on the structure of FIGS. 13 and 14, according to an embodiment of the invention.

FIG. 15 is a schematic cross-sectional view taken along the line A-A in FIG. 16, and FIG. 16 is a schematic top view illustrating manufacturing of a memory device. Referring to FIGS. 15 and 16, wordline metal layers 155 are deposited on the ferroelectric high-k dielectric layer 150 between the patterned stacks including the layers 130, 120 and 115. Excess wordline metal material above the hardmasks 130 is removed by a planarization process, such as, for example, CMP, which is performed down to the hardmasks 130.

According to an embodiment, the metal layers 155 comprise an electrically conductive material, such as, but not necessarily limited to, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The metal layers 155 can be deposited using, for example, CVD, PECVD, RFCVD, PVD, ALD, MLD, MBD, PLD, LSMCD, and/or sputtering, followed by CMP.

Figure 17:
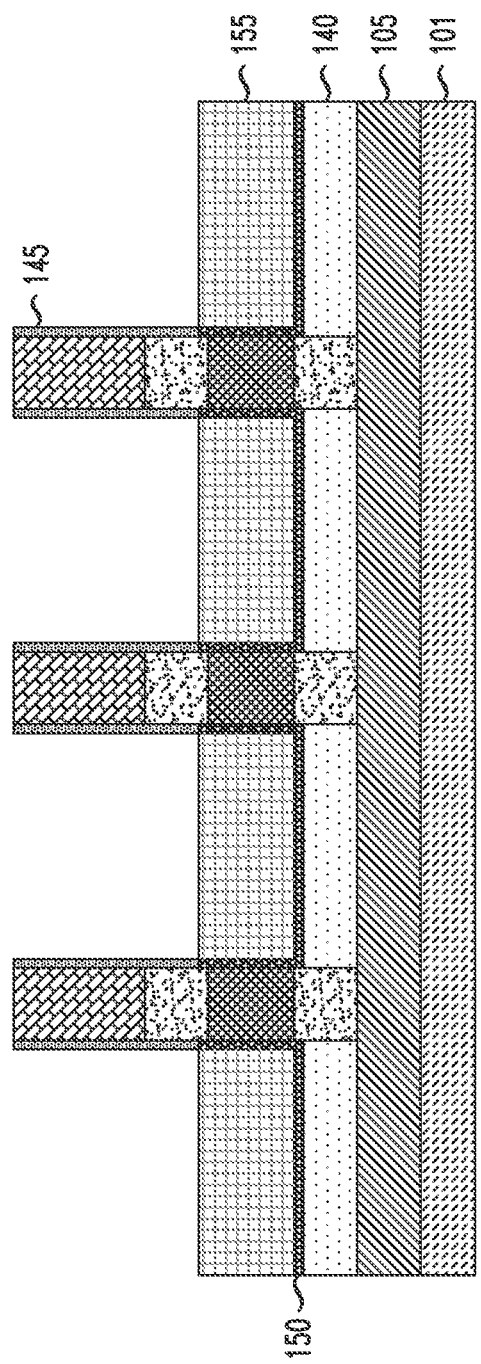
FIG. 17 is a schematic cross-sectional view taken along the line A-A in FIG. 18 illustrating manufacturing of a memory device and showing metal and high-k dielectric layer recessing, according to an embodiment of the invention.
Figure 18:
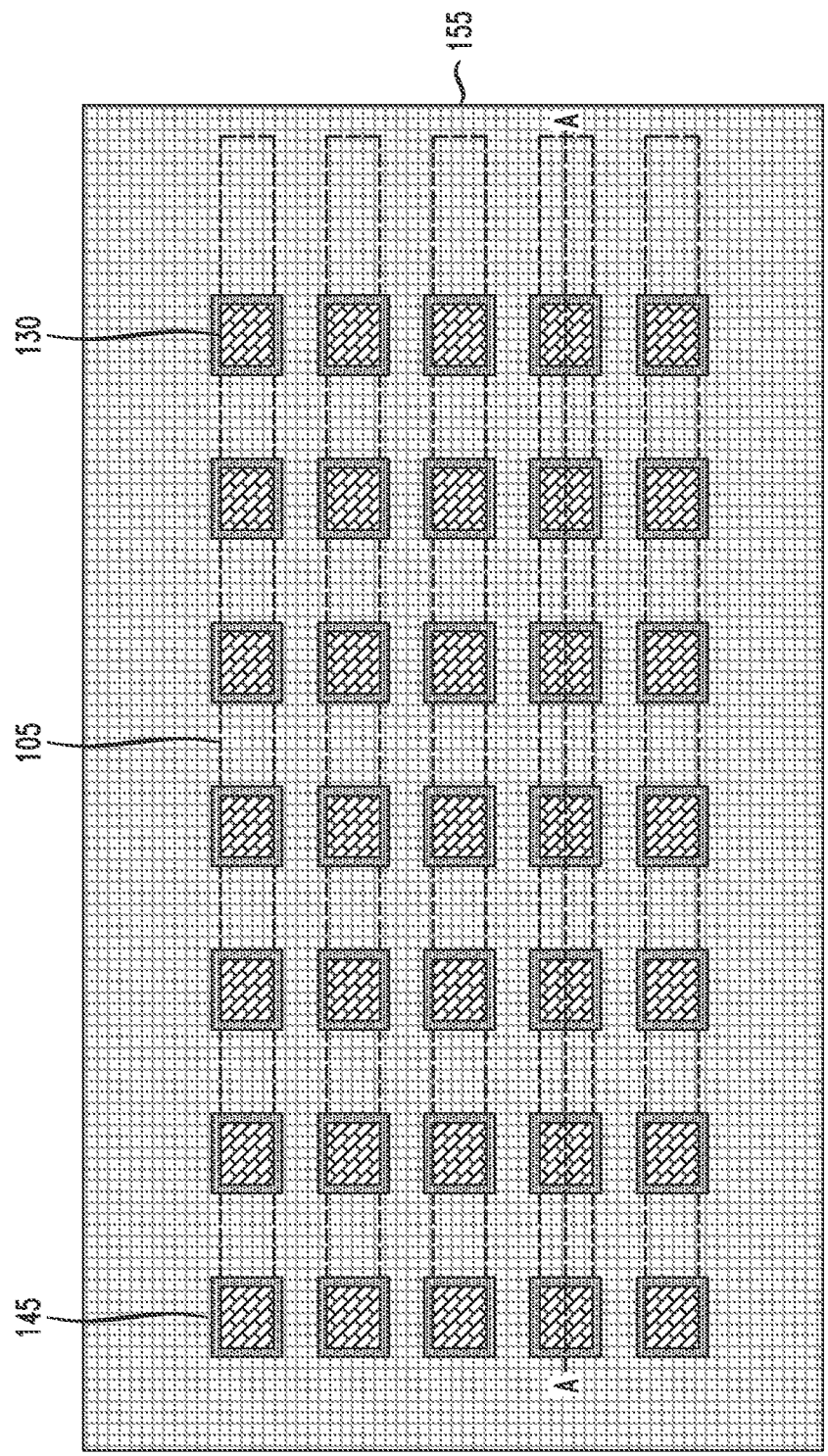
FIG. 18 is a schematic top view illustrating manufacturing of a memory device and showing metal and high-k dielectric layer recessing, according to an embodiment of the invention.

FIG. 17 is a schematic cross-sectional view taken along the line A-A in FIG. 18, and FIG. 18 is schematic top view illustrating manufacturing of a memory device and showing metal and high-k dielectric layer recessing, according to an embodiment of the invention. Referring to FIGS. 17 and 18, portions of the wordline metal layers 155 and the ferroelectric high-k dielectric layers 150 are selectively removed with respect to the hanging spacers 145 using, for example, an anisotropic etch process, such as RIE, ion beam etching, plasma etching or laser ablation. As can be seen, the wordline metal layers 155 and the ferroelectric high-k dielectric layer 150 are recessed to a lower height to be at substantially the same height as, or slightly above or below an upper edge of the polysilicon layer 115, which will function as a channel region of each transistor stack including polysilicon layers 110 and 120 functioning as lower and upper source/drain regions, respectively. According to an embodiment, recessing is performed by a wet or dry etching process that is selective with respect to materials of the hanging spacers 145 and the hardmasks 130. Etch chemistry for recessing the wordline metal layers 155 can include, for example, a $SiF_6$/$CHF_3$ plasma, and for recessing the ferroelectric high-k dielectric layers 150 can include, for example, RIE with $SiCl_4$/$Cl_2$ plasma or wet etch with buffered HF (10% HF).

Figure 19:
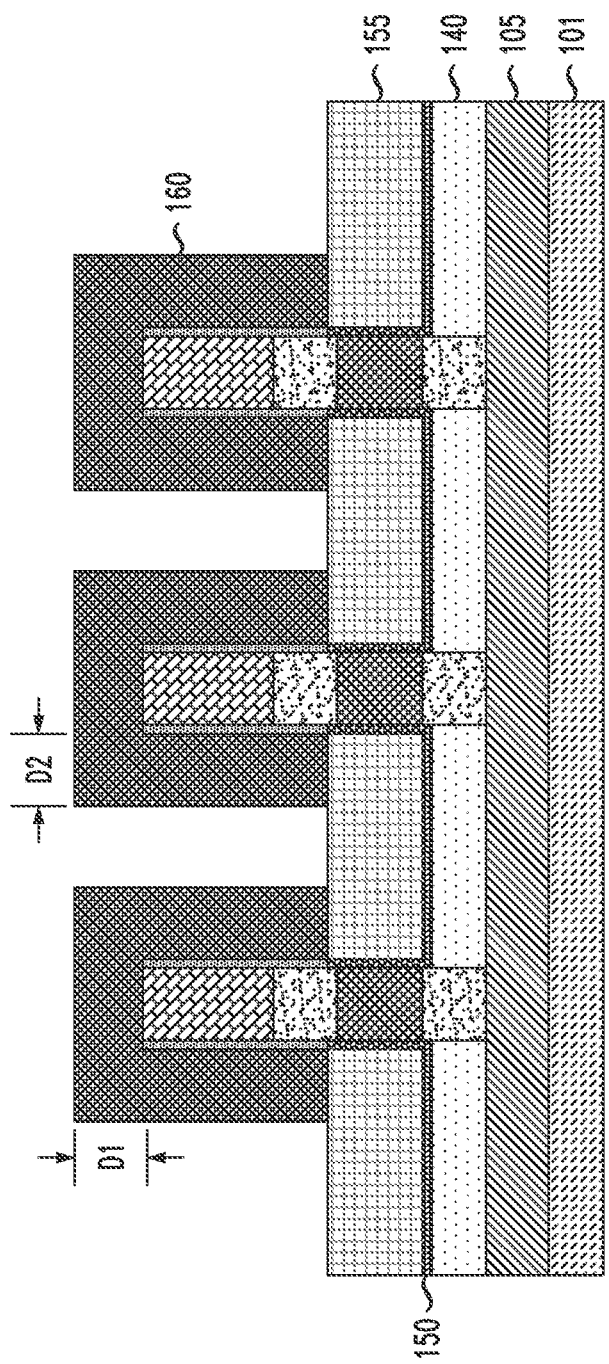
FIGS. 19 and 20 are schematic cross-sectional views taken along the lines A-A and B-B in FIG. 21 illustrating manufacturing of a memory device and showing hardmask formation for use in connection with metal patterning, according to an embodiment of the invention.
Figure 20:
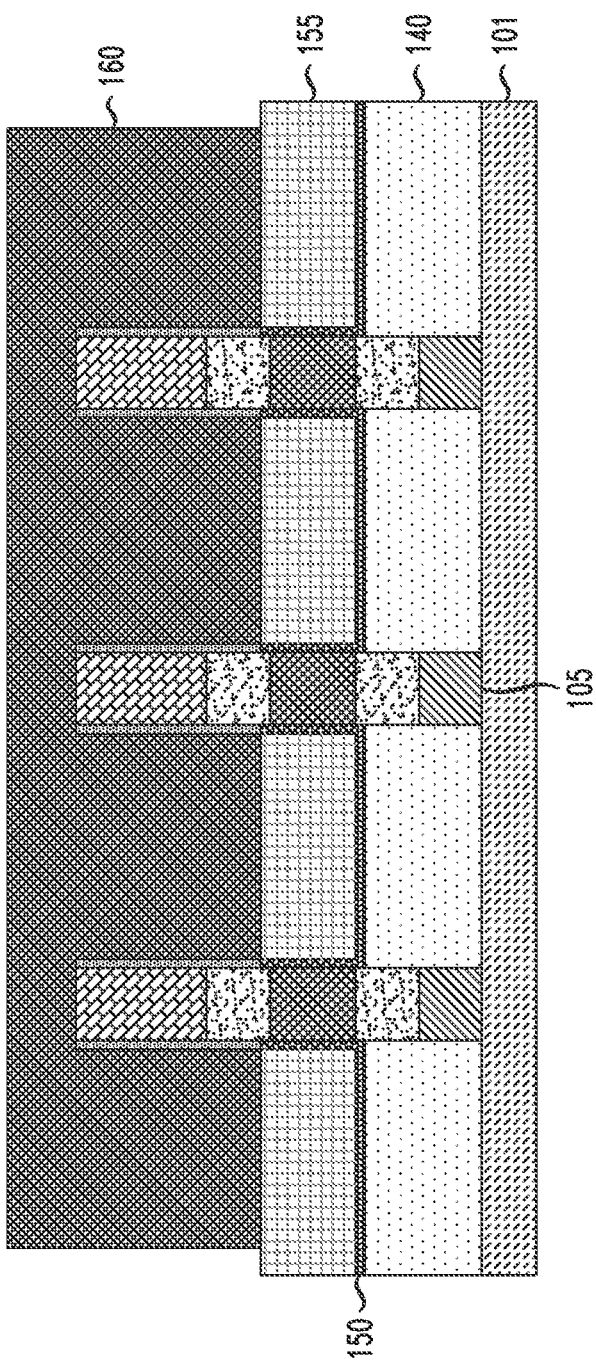
Figure 21:
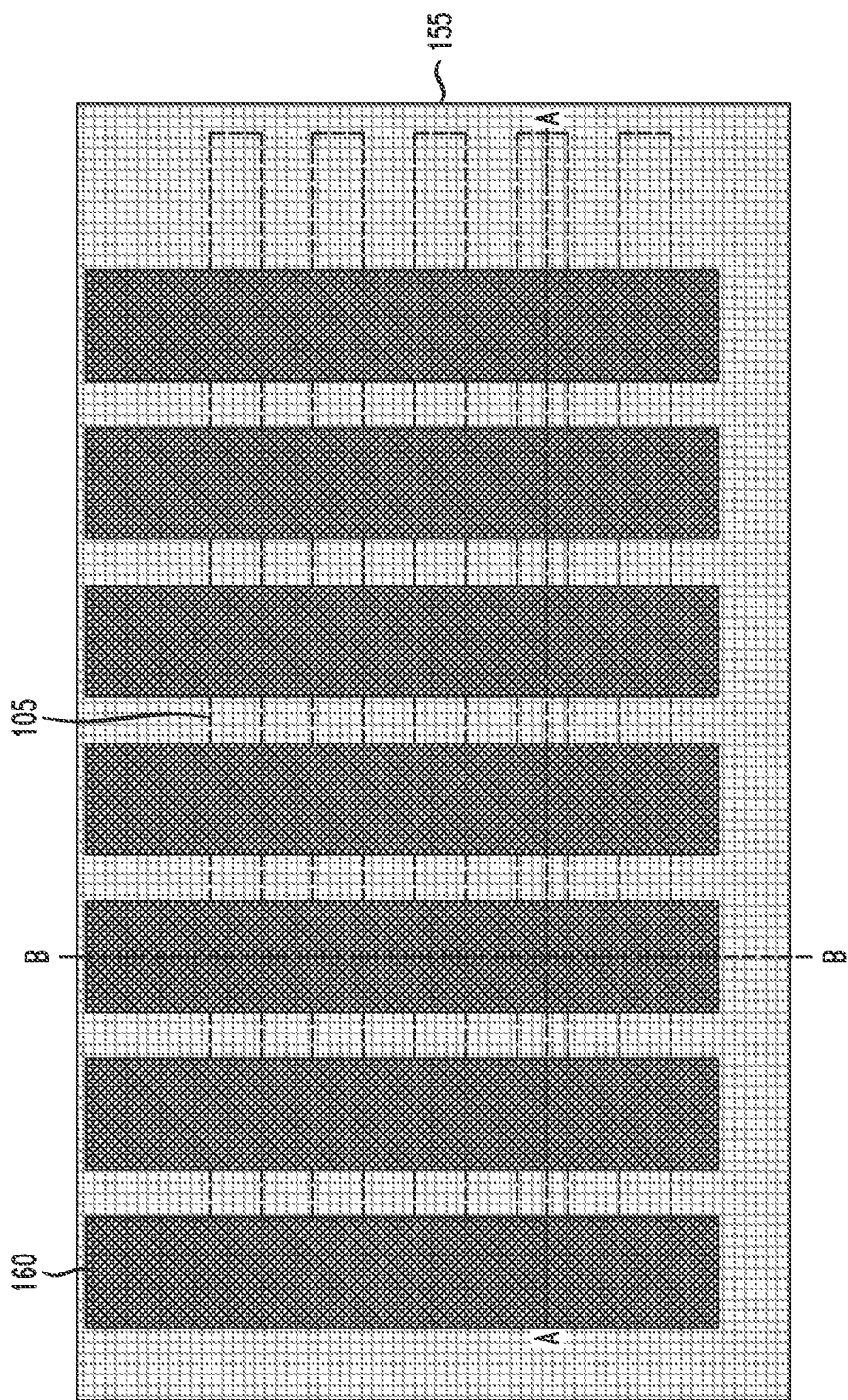
FIG. 21 is a schematic top view illustrating manufacturing of a memory device and showing hardmask formation for use in connection with metal patterning, according to an embodiment of the invention.

FIGS. 19 and 20 are schematic cross-sectional views taken along the lines A-A and B-B in FIG. 21, and FIG. 21 is a schematic top view illustrating manufacturing of a memory device and showing hardmask formation for use in connection with metal patterning, according to an embodiment of the invention. Referring to FIGS. 19-21, hardmasks 160 are formed on and around the patterned stacks including top surfaces of the hardmasks 130 and top and side surfaces of the hanging spacers 145. The hardmasks 160 are further formed on portions of the recessed wordline metal layers 155 adjacent the patterned stacks. As can be seen in FIGS. 20 and 21, each hardmask 160 covers a plurality of patterned stacks, and extends across multiple select lines 105. The hardmasks 160 comprise, for example, a dielectric material, such as, for example an oxide or a nitride (e.g., silicon nitride), and are deposited using, for example, for example, CVD, PECVD, RFCVD, PVD, ALD, MLD, MBD, PLD, LSMCD, and/or sputtering.

Referring, for example, to FIG. 19, dimensions D1 and D2 of the hardmask 160 may be for example, about 10 nm-about 30 nm for both D1 and D2, but are not necessarily limited thereto.

Figure 22:
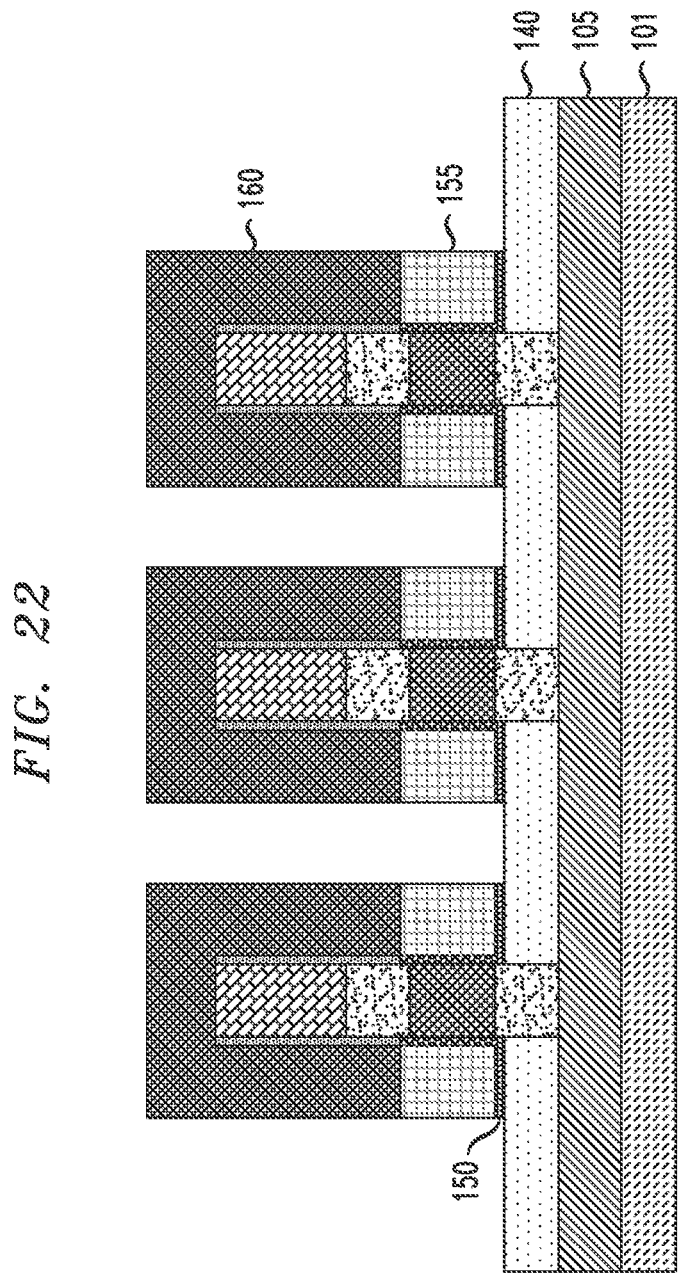
FIGS. 22 and 23 are schematic cross-sectional views taken along the lines A-A and B-B in FIG. 24 illustrating manufacturing of a memory device and showing metal patterning to form wordlines, according to an embodiment of the invention.
Figure 23:
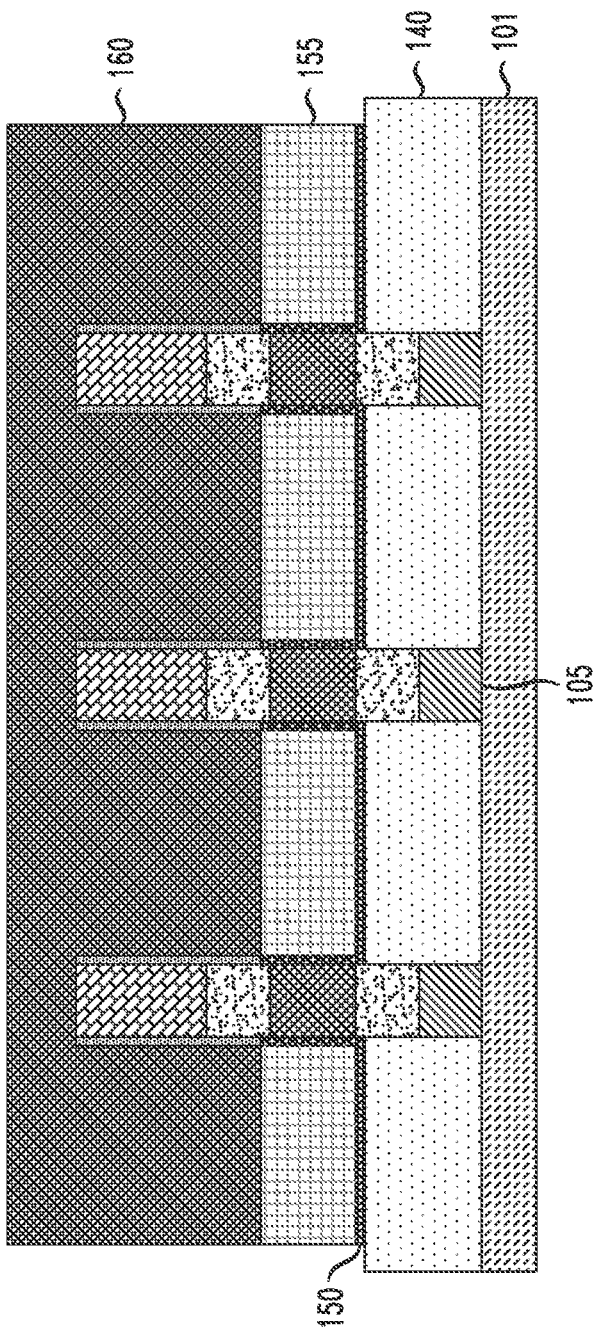
Figure 24:
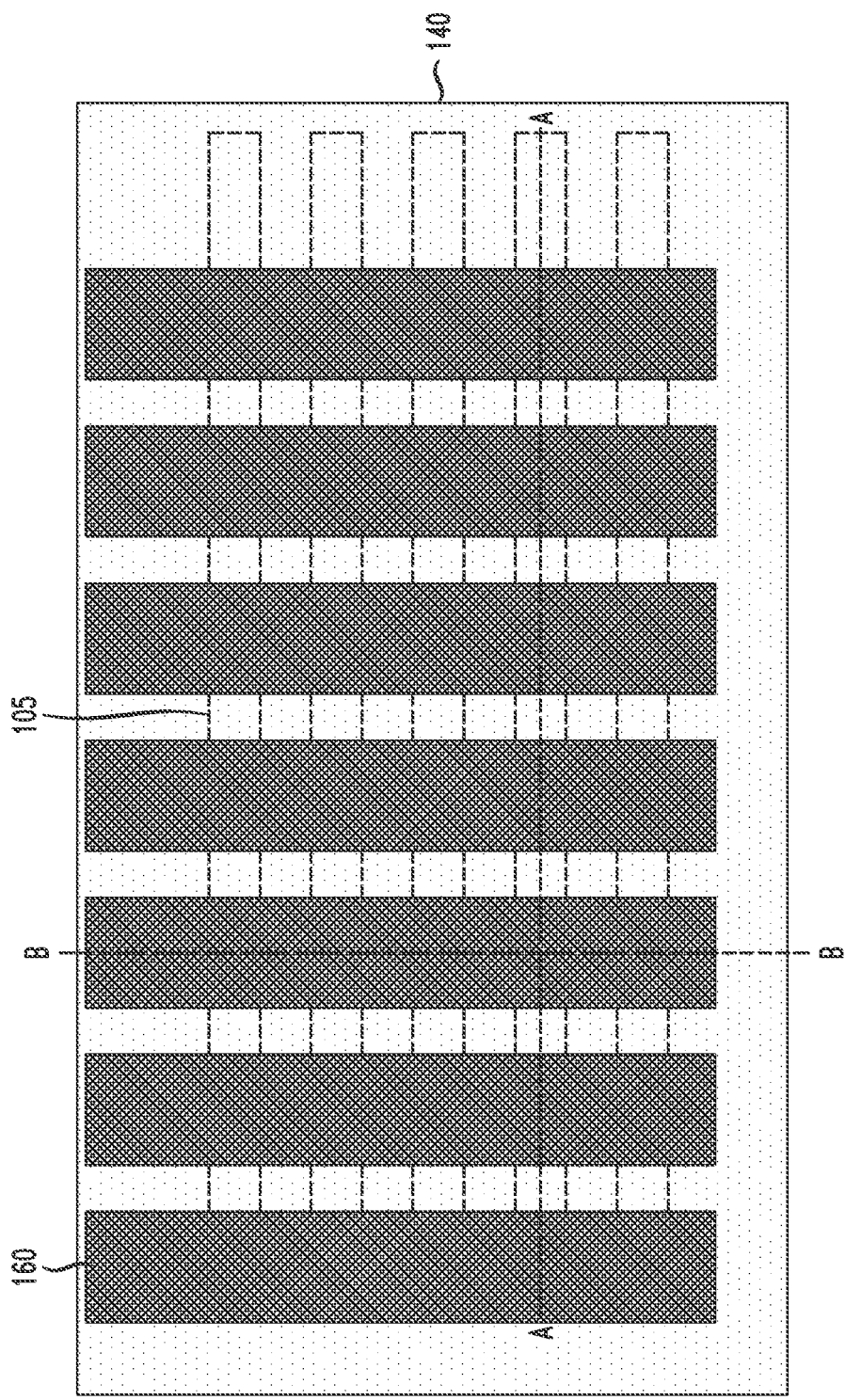
FIG. 24 is a schematic top view illustrating manufacturing of a memory device and showing metal patterning to form wordlines, according to an embodiment of the invention.
Figure 25:
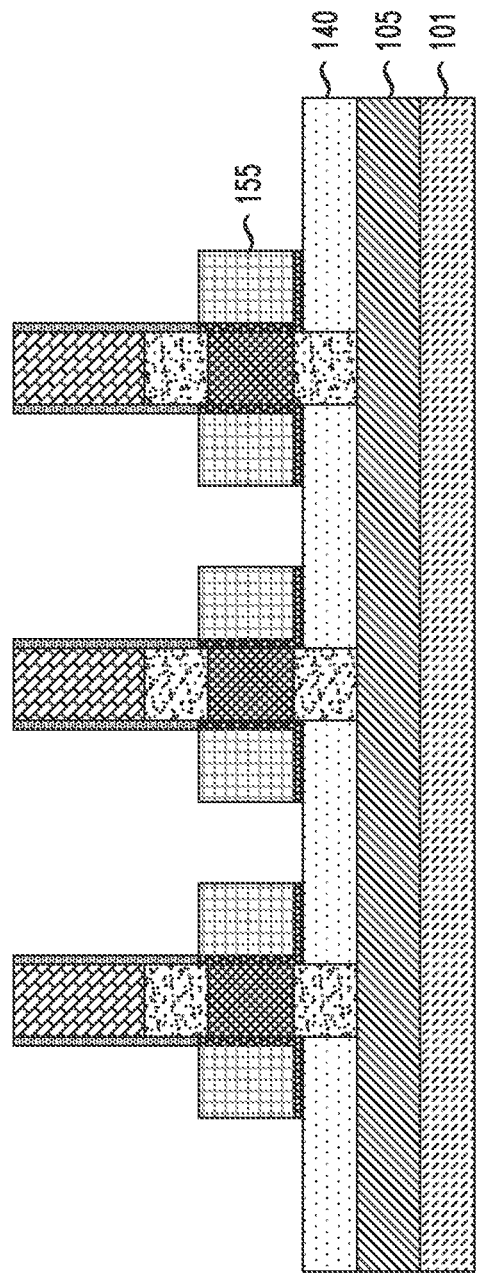
FIGS. 25 and 26 are schematic cross-sectional views taken along the lines A-A and B-B in FIG. 27 illustrating manufacturing of a memory device and showing hardmask removal, according to an embodiment of the invention.
Figure 26:
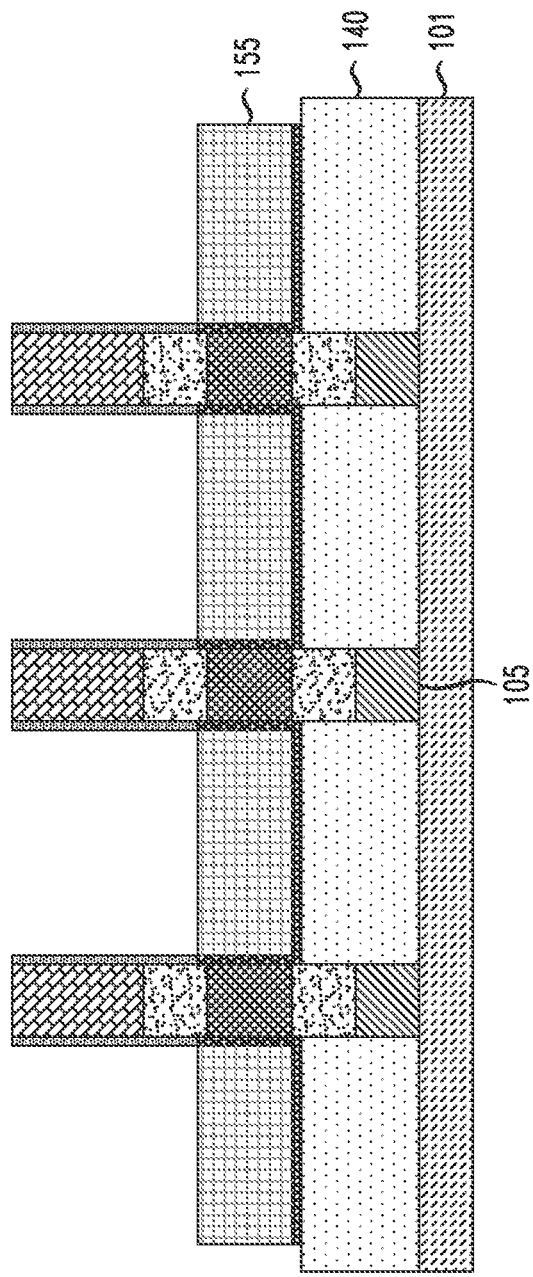
Figure 27:
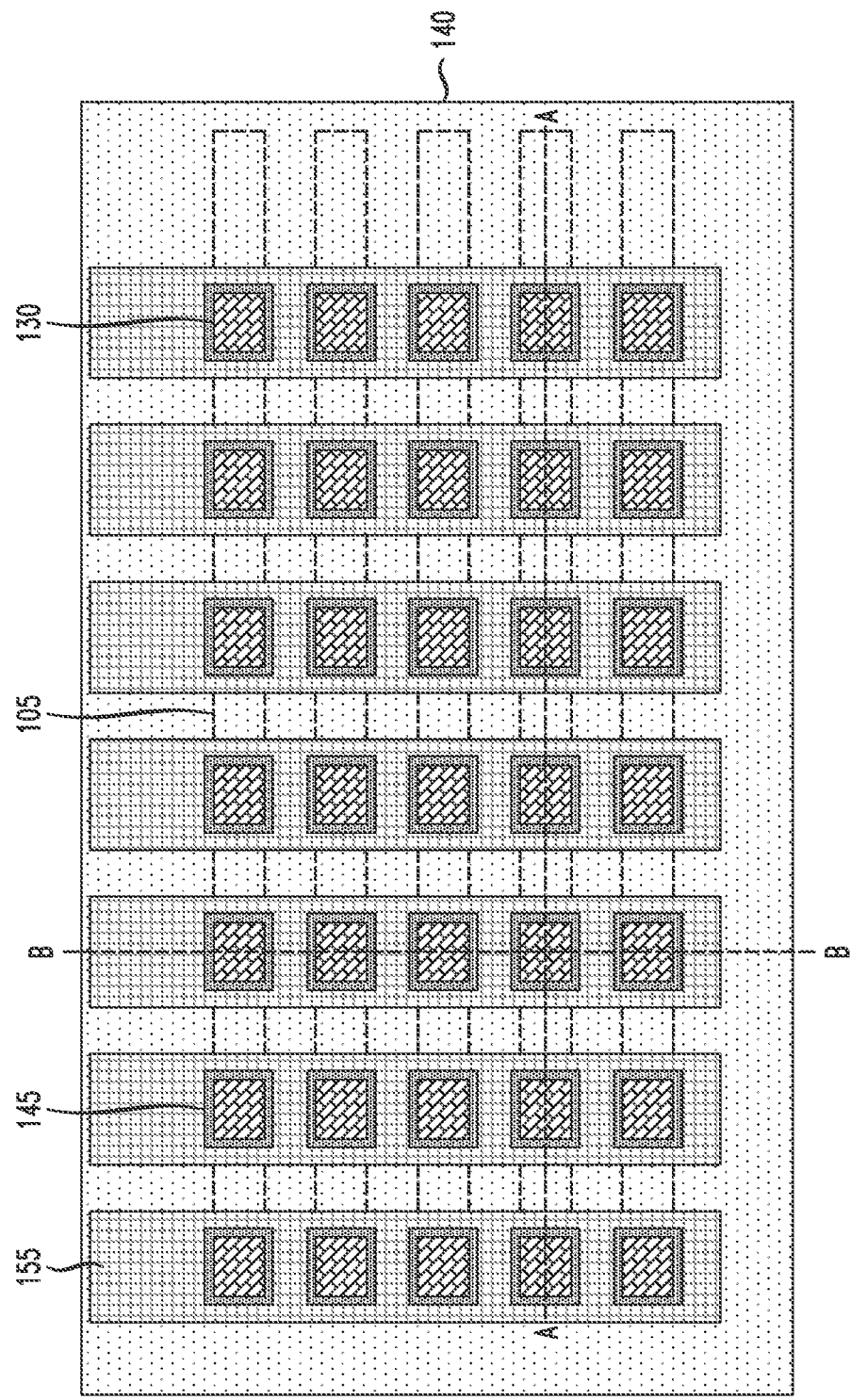
FIG. 27 is a schematic top view illustrating manufacturing of a memory device and showing hardmask removal, according to an embodiment of the invention.

FIGS. 22 and 23 are schematic cross-sectional views taken along the lines A-A and B-B in FIG. 24, and FIG. 24 is a schematic top view illustrating manufacturing of a memory device and showing metal patterning to form wordlines, according to an embodiment of the invention. Referring to FIGS. 22-24, exposed portions of the wordline metal layers 155 and underlying ferroelectric high-k dielectric layers 150 not covered by the hardmasks 160 are removed from the dielectric layer 140. According to an embodiment, removal is performed by a wet or dry etching process using, for example, a $SiF_6/CHF_3$ plasma for the metal layer and a $SiCl_4/Cl_2$ plasma or buffered HF for the high-k material. Referring to FIGS. 25-27, following removal of the exposed portions of the wordline metal layers 155 and underlying ferroelectric high-k dielectric layers 150, the hardmasks 160 are removed using, for example, using a $CF_4/O_2$ or $CHF_3/O_2$ plasma.

Figure 28:
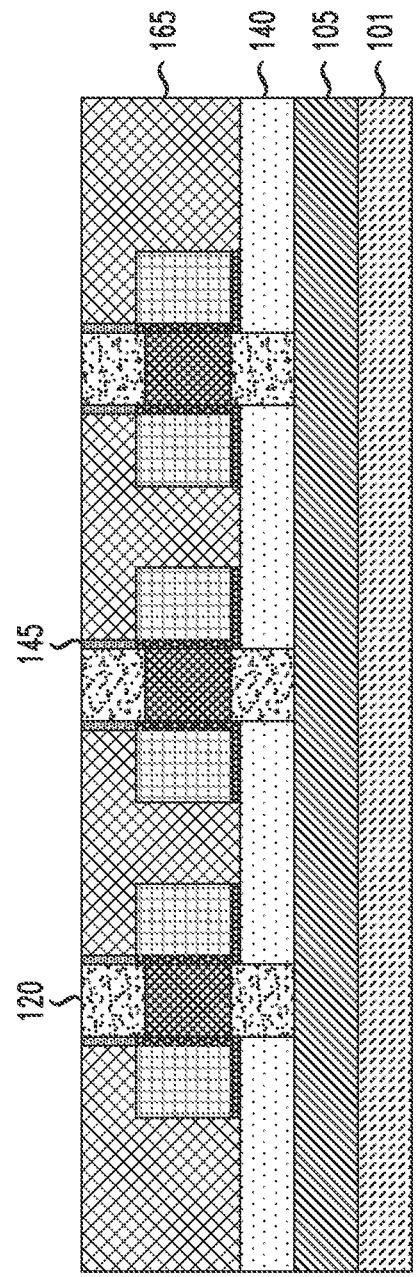
FIGS. 28 and 29 are schematic cross-sectional views taken along the lines A-A and B-B in FIG. 30 illustrating manufacturing of a memory device and showing formation of a dielectric layer and planarization, according to an embodiment of the invention.
Figure 29:
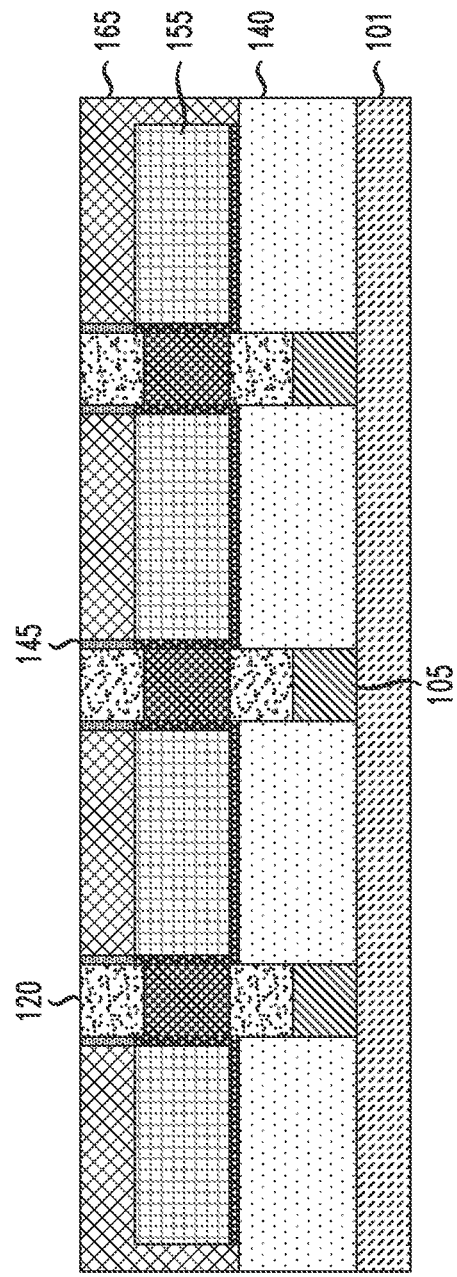
Figure 30:
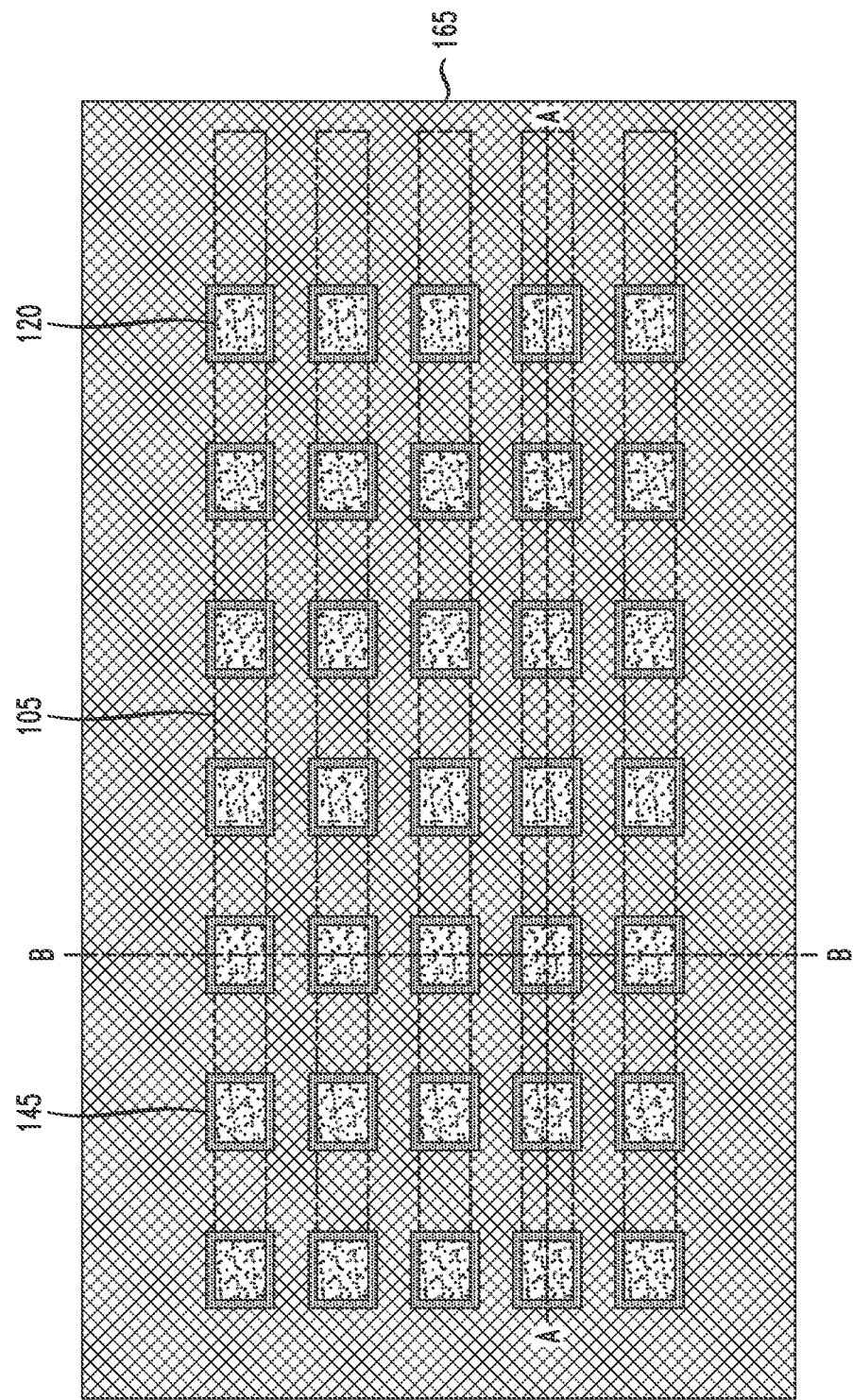
FIG. 30 is a schematic top view illustrating manufacturing of a memory device and showing formation of a dielectric layer and planarization, according to an embodiment of the invention.

FIGS. 28 and 29 are schematic cross-sectional views taken along the lines A-A and B-B in FIG. 30, and FIG. 30 is a schematic top view illustrating manufacturing of a memory device and showing formation of a dielectric layer and planarization, according to an embodiment of the invention. Referring to FIGS. 28-30, an ILD layer 165 is deposited on the structure of FIGS. 25-27. The material of the ILD layer 165 can include, but is not necessarily limited to, a low-K dielectric material, such as, for example, silicon oxide, silicon nitride, silicon oxynitride, boron nitride, and/or silicon boron nitride. The dielectric layer 165 is deposited using deposition techniques such as, for example, CVD, PECVD, RFCVD, PVD, ALD, MBD, PLD, LSMCD, and/or sputtering, which is followed by a planarization process, such as, CMP, down to the upper polysilicon layers 120, exposing the top surfaces of the upper polysilicon layers 120. The planarization removes the hardmasks 130, portions of the hanging spacers 145 on the hardmasks 130, and excess portions of the ILD layer 165 to result in the structure shown in FIGS. 28-30.

Figure 31:
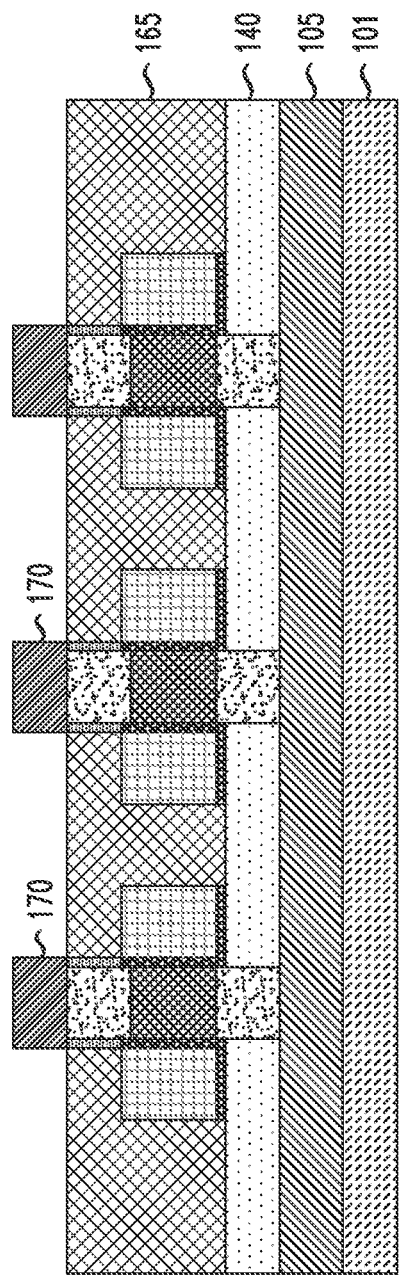
FIGS. 31 and 32 are schematic cross-sectional views taken along the lines A-A and B-B in FIG. 33 illustrating manufacturing of a memory device and showing bitline formation, according to an embodiment of the invention.
Figure 32:
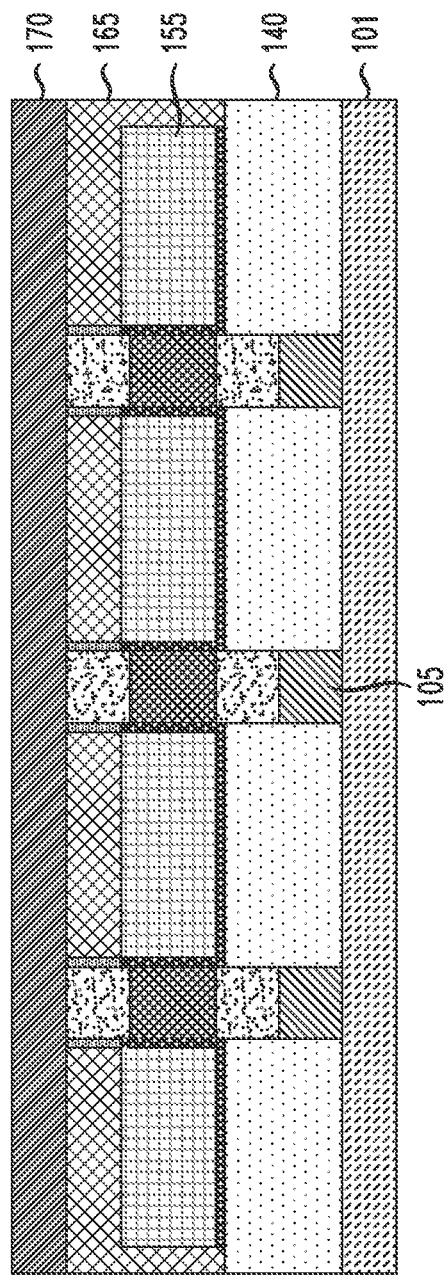
Figure 33:
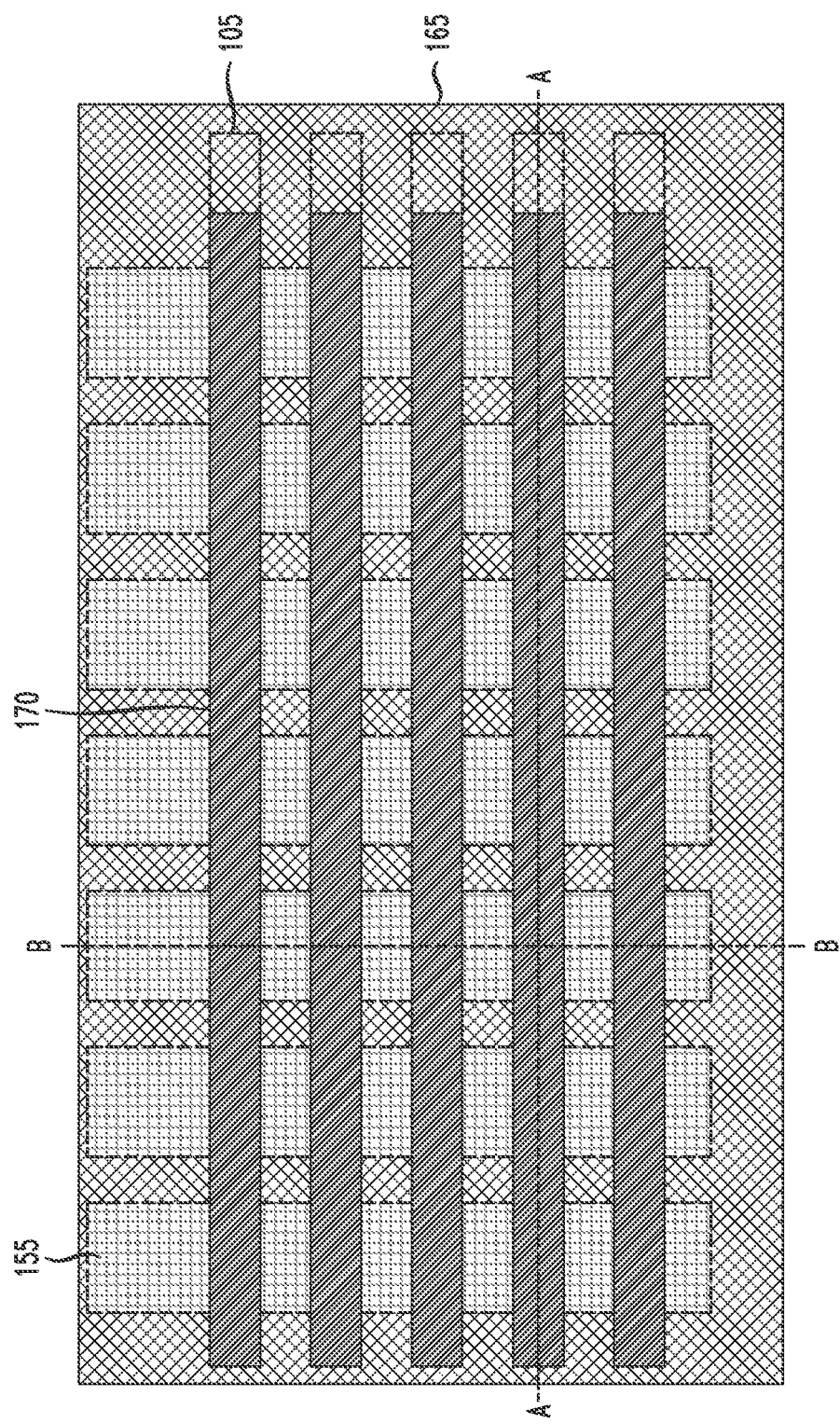
FIG. 33 is a schematic top view illustrating manufacturing of a memory device and showing bitline formation, according to an embodiment of the invention.

FIGS. 31 and 32 are schematic cross-sectional views taken along the lines A-A and B-B in FIG. 33, and FIG. 33 is a schematic top view illustrating manufacturing of a memory device and showing bitline formation, according to an embodiment of the invention. Referring to FIGS. 31-33, a plurality of bitlines 170 are formed on the ILD layer 165 to be spaced apart from each other in positions corresponding to the stacked structures including layers 120, 115 and 110. The bitlines 170 electrically contact their corresponding upper polysilicon layers 120 (upper source/drain region), and the select lines 105 electrically contact the lower polysilicon layers 110 (lower source/drain region). The middle polysilicon layer 115 is a channel region between the upper and lower source/drain regions. The wordlines 155 function as gate electrodes of the 3T transistors formed by the stacked structures including layers 120, 115 and 110.

As can be seen in the top view of FIG. 33, the bitlines 170 are oriented to have a length (longer dimension) extension direction which is parallel to the length (longer dimension) extension direction of the select lines 105 and perpendicular to the length (longer dimension) extension direction of the wordlines 155. In order to form a cross-point memory structure, the plurality of bitlines and/or the plurality of select lines must be perpendicular to the plurality of wordlines. In FIG. 33, the select lines 105 and wordlines 155 are shown as dotted lines because they are hidden by the ILD layer 165. In the top views, elements outlined by dotted lines are hidden by overlying layers.

The material of the bitlines 165 can include an electrically conductive material, such as, but not necessarily limited to, tungsten, cobalt, zirconium, tantalum, titanium, aluminum, ruthenium, copper, silver, metal carbides (e.g., tantalum carbide, titanium carbide, tantalum magnesium carbide), metal nitrides (e.g., titanium nitride), transition metal aluminides or combinations thereof. The bitlines 165 can be deposited using, for example, CVD, PECVD, RFCVD, PVD, ALD, MLD, MBD, PLD, LSMCD, and/or sputtering, followed by planarization by, for example, CMP. In accordance with an embodiment of the present invention, a whole bitline layer is deposited and then patterned into individual portions that are spaced apart from each other. The bitlines 165 can be patterned to be spaced apart from each other, using, for example, photolithography and ME, which may optionally include a dielectric hard mask such as an oxide or nitride.

Figure 34:
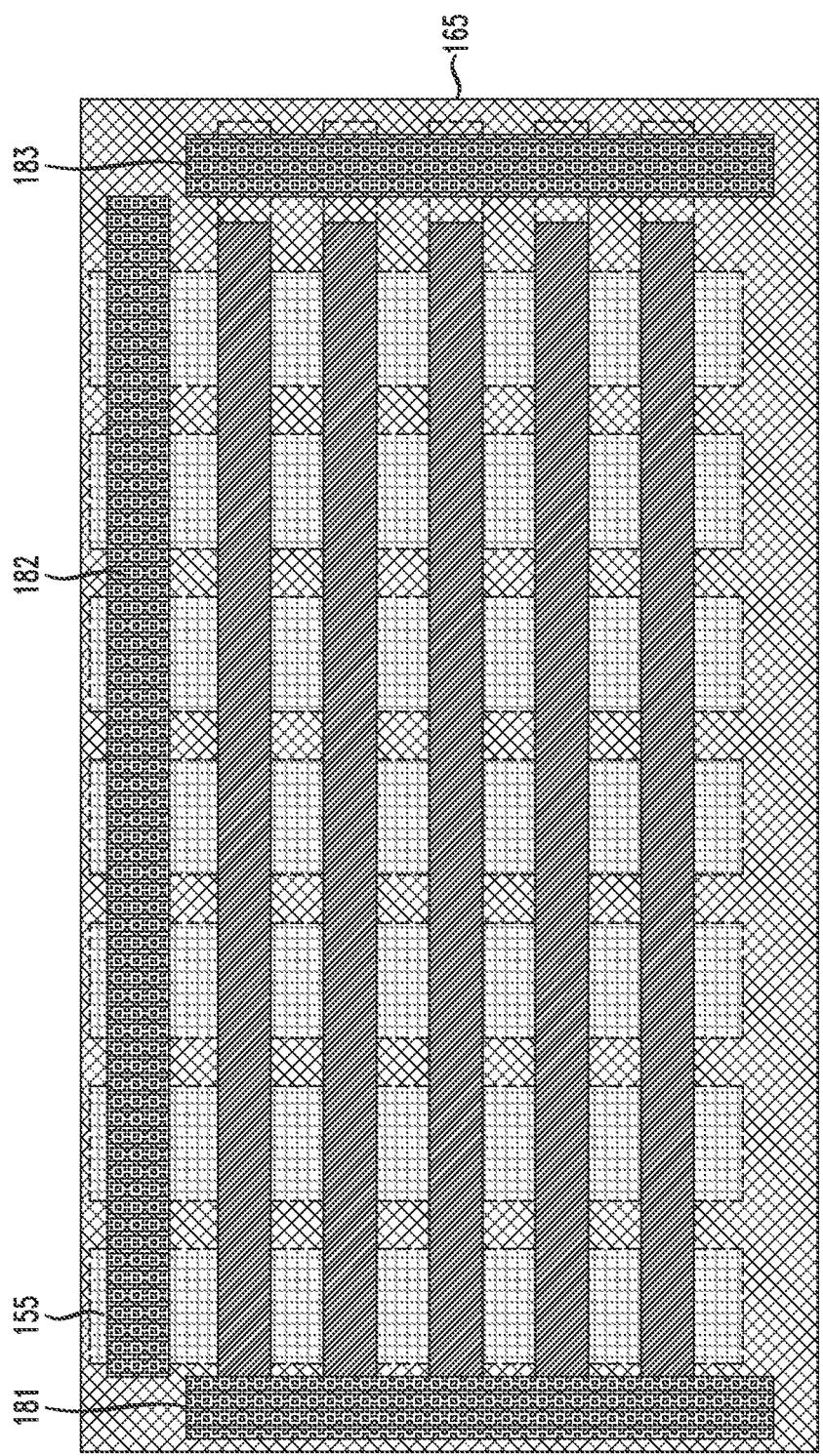
FIG. 34 is a schematic top view illustrating manufacturing of a memory device and showing contact formation, according to an embodiment of the invention.

FIG. 34 is a schematic top view illustrating manufacturing of a memory device and showing contact formation, according to an embodiment of the invention. Referring to FIG. 34, an individual bitline contact region 181 includes contacts to respective individual bitlines 170, an individual gate access (wordline) contact region 182 includes contacts to respective individual wordlines 155, and an individual select line contact region 183 includes contacts to respective individual select lines 105. The contacts may be formed in trenches in a dielectric layer by filling the trenches with contact material, such as, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trenches before filling the trenches with the contact material layers. Deposition of the contact material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Figure 35A:
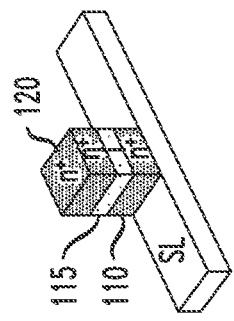
FIG. 35A is a three-dimensional schematic diagram of a transistor stack formed on a select line for a memory cell, according to an embodiment of the invention.
Figure 35B:
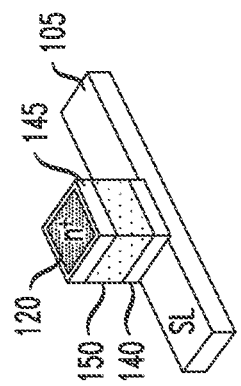
FIG. 35B is a three-dimensional schematic diagram of spacer and dielectric layers formed on a transistor stack for a memory cell, according to an embodiment of the invention.
Figure 35C:
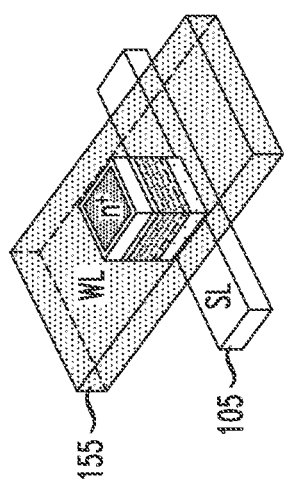
FIG. 35C is a three-dimensional schematic diagram illustrating a wordline added to the structure of FIG. 35B, according to an embodiment of the invention.
Figure 35D:
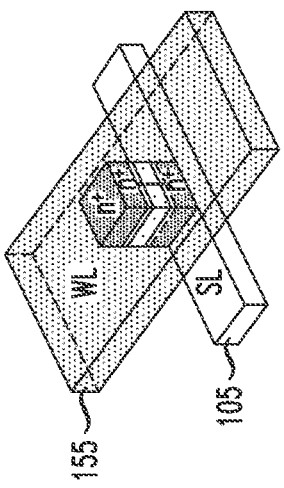
FIG. 35D is a three-dimensional schematic diagram of the structure in FIG. 35C without the spacer and dielectric layers, according to an embodiment of the invention.
Figure 35E:
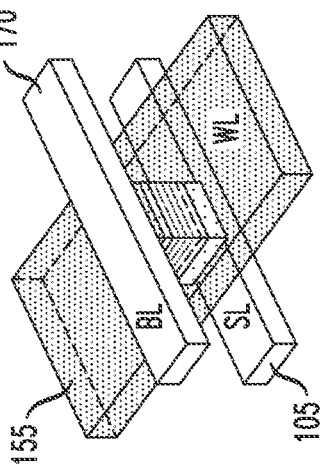
FIG. 35E is a three-dimensional schematic diagram illustrating a bitline added to the structure of FIG. 35C in a first orientation, according to an embodiment of the invention.
Figure 35F:
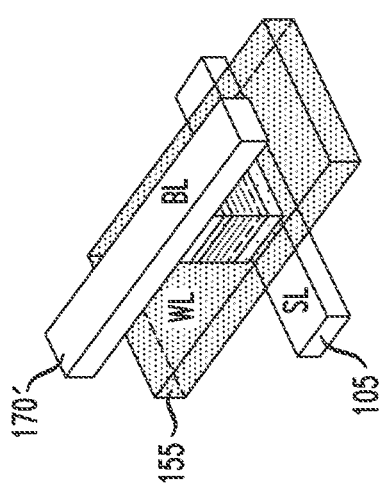
FIG. 35F is a three-dimensional schematic diagram illustrating a bitline added to the structure of FIG. 35C in a second orientation, according to an embodiment of the invention.

A high-level overview of the embodiments is shown in the three-dimensional schematic diagrams of FIGS. 35A-35F. FIG. 35A shows a transistor stack including layers 110, 115 and 120 formed on a select line 105 for a memory cell of a memory cell array. FIG. 35B illustrates hanging spacer layer 145, ferroelectric high-k dielectric layer 150 and dielectric layer 140 formed on a transistor stack for a memory cell of a memory cell array. FIG. 35C illustrates a wordline 155 (e.g., gate electrode) added to the structure of FIG. 35B, and FIG. 35D illustrates structure in FIG. 35C without the spacer and dielectric layers 145, 150 and 140. FIG. 35E illustrates a bitline 170 added to the structure of FIG. 35C, and contacting the upper polysilicon layer 120 of the transistor stack. Similar to FIG. 35E, FIG. 35F also illustrates a bitline 170' added to the structure of FIG. 35C, and contacting the upper polysilicon layer 120 of the transistor stack. Unlike the bitline 170 in FIG. 35E, the bitline 170' in FIG. 35F is oriented parallel to the wordline 155. As noted above, in order to form a cross-point memory structure, the plurality of bitlines and/or the plurality of select lines must be perpendicular to the plurality of wordlines.

In accordance with an embodiment of the present invention, the device 100 formed in connection with FIGS. 1-34 is a memory device configured in a cross-point structure, including the transistor stacks including layers 120, 115 and 110 for each memory cell of a memory cell array, wherein a channel layer (e.g. layer 115) is surrounded by a gate structure comprising a gate metal layer (e.g., wordline layer 155) formed on a ferroelectric high-k dielectric layer 150. The memory cells are interposed between bitlines 170 and select lines 105, and gated by wordlines 155 in a cross-point structure. Multiple cross-point structures including the memory cells interposed between bitlines and select lines, and gated by wordlines 155, as described above, may be stacked on top of each other, thus forming a 3D stacked cross-point structure. Each of the cross-point structures comprising the 3D stacked cross-point structure may be fabricated using the fabrication processes as described above with reference to FIGS. 1-34.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:
   forming a first polysilicon layer on a conductive layer;
   forming a second polysilicon layer stacked on the first polysilicon layer, and a third polysilicon layer stacked on the second polysilicon layer;
   patterning a stacked structure of the first, second and third polysilicon layers into a plurality of stacked structures spaced apart from each other on the conductive layer;
   forming ferroelectric dielectric layers on respective second polysilicon layers of the plurality of stacked structures;
   forming metal layers on the ferroelectric dielectric layers; and
   forming spacers on side portions of respective third polysilicon layers of the plurality of stacked structures prior to forming the ferroelectric dielectric layers;
   wherein the ferroelectric dielectric layers are formed on the respective second polysilicon layers under bottom surfaces of respective ones of the spacers, the bottom surfaces extending from the side portions of the respective third polysilicon layers.

2. The method of claim 1, wherein the first and third polysilicon layers have a first doping type, and the second polysilicon layer is undoped or has a second doping type different from the first doping type.

3. The method according to claim 1, wherein the ferroelectric dielectric layers comprise at least one of $HfO_2$ doped with yttrium (Y), aluminum (Al), gadolinium (Gd), strontium (Sr), or lanthanum (La), and thin films of $HfO_2$-$ZrO_2$ solid solutions.

4. The method according to claim 1, wherein the ferroelectric dielectric layers contact the respective second polysilicon layers of the plurality of stacked structures.

5. The method according to claim 1, further comprising forming dielectric layers on side portions of respective first polysilicon layers of the plurality of stacked structures prior to forming the ferroelectric dielectric layers.

6. The method according to claim 1, further comprising recessing the ferroelectric and metal layers.

7. The method according to claim 6, further comprising:
   covering portions of the recessed ferroelectric and metal layers adjacent the plurality of stacked structures with a mask; and
   removing uncovered portions of the recessed ferroelectric and metal layers.

8. The method according to claim 1, further comprising forming a plurality of bitlines on the third polysilicon layers of the plurality of stacked structures.

9. The method according to claim 1, wherein the conductive layer comprises a select line.

10. The method according to claim 1, wherein the metal layers are wordlines.

11. The method according to claim 1, wherein:
    the first and third polysilicon layers of each stacked structure of the plurality of stacked structures are respective first and second source/drain regions of a transistor; and
    the second polysilicon layer of each stacked structure of the plurality of stacked structures is a channel region of the transistor.

12. The method according to claim 11, wherein the ferroelectric and metal layers corresponding to each stacked structure of the plurality of stacked structures comprise a gate structure of the transistor.

13. The method according to claim 1, wherein forming the first, second and third polysilicon layers comprises transforming first, second and third silicon layers into the first, second and third polysilicon layers.

14. The method according to claim 1, wherein the plurality of stacked structures are parts of a memory cell array having a three-dimensional (3D) cross-point structure.

15. A method for manufacturing a semiconductor memory device, comprising:
    forming a first polysilicon source/drain region on a conductive layer;
    forming a polysilicon channel region stacked on the first polysilicon source/drain region, and a second polysilicon source/drain region stacked on the polysilicon channel region;
    patterning a stacked structure of the first and second polysilicon source/drain regions and the polysilicon channel region into a plurality of stacked structures spaced apart from each other on the conductive layer;
    forming ferroelectric dielectric layers on respective polysilicon channel regions of the plurality of stacked structures;
    forming metal layers on the ferroelectric dielectric layers;
    forming a plurality of bitlines on the second polysilicon source/drain regions of the plurality of stacked structures; and
    forming spacers on side portions of respective second polysilicon source/drain regions of the plurality of stacked structures prior to forming the ferroelectric dielectric layers;
    wherein the ferroelectric dielectric layers are formed on the respective polysilicon channel regions under bottom surfaces of respective ones of the spacers, the bottom surfaces extending from the side portions of the respective second polysilicon source/drain regions.

16. The method according to claim 15, wherein the ferroelectric dielectric layers comprise at least one of $HfO_2$ doped with yttrium (Y), aluminum (Al), gadolinium (Gd), strontium (Sr), or lanthanum (La), and thin films of $HfO_2$-$ZrO_2$ solid solutions.

17. The method according to claim 15, wherein the ferroelectric dielectric layers contact the respective polysilicon channel regions of the plurality of stacked structures.

18. The method according to claim 15, further comprising forming dielectric layers on side portions of respective first polysilicon source/drain regions of the plurality of stacked structures prior to forming the ferroelectric dielectric layers.

19. The method according to claim 15, further comprising recessing the ferroelectric and metal layers.

20. The method according to claim 19, further comprising:
- covering portions of the recessed ferroelectric and metal layers adjacent the plurality of stacked structures with a mask; and
- removing uncovered portions of the recessed ferroelectric and metal layers.

* * * * *